United States Patent
Suzuki et al.

(10) Patent No.: US 10,607,618 B2
(45) Date of Patent: *Mar. 31, 2020

(54) ENCODER AND ENCODING METHOD, DECODER AND DECODING METHOD, AND PROGRAM

(71) Applicant: SONY CORPORATION, Tokyo (JP)

(72) Inventors: Shiro Suzuki, Kanagawa (JP); Yuuki Matsumura, Saitama (JP); Yasuhiro Toguri, Kanagawa (JP); Yuuji Maeda, Tokyo (JP); Jun Matsumoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/248,281

(22) Filed: Jan. 15, 2019

(65) Prior Publication Data
US 2019/0164559 A1    May 30, 2019

Related U.S. Application Data

(63) Continuation of application No. 15/680,332, filed on Aug. 18, 2017, now Pat. No. 10,255,925, which is a
(Continued)

(30) Foreign Application Priority Data

Jan. 17, 2012    (JP) .................................. 2012-006972

(51) Int. Cl.
*G10L 19/035*    (2013.01)
*H03M 7/40*      (2006.01)
(Continued)

(52) U.S. Cl.
CPC .......... *G10L 19/035* (2013.01); *G10L 19/038* (2013.01); *H03M 7/4037* (2013.01);
(Continued)

(58) Field of Classification Search
CPC . G10L 19/035; G10L 19/038; G10L 19/0017; H04N 19/124; H04N 19/15; H04N 19/48; H04N 19/91; H03M 7/4037
See application file for complete search history.

(56) References Cited

U.S. PATENT DOCUMENTS

| 2004/0164882 A1 | 8/2004 | Touyama et al. |
| 2009/0161697 A1 | 6/2009 | Wang et al. |
| 2011/0084858 A1 | 4/2011 | Suzuki et al. |

FOREIGN PATENT DOCUMENTS

| JP | 05-110450 | 4/1993 |
| JP | 07-212243 | 8/1995 |

(Continued)

OTHER PUBLICATIONS

Aug. 6, 2015, JP communication issued for related JP application No. 2013-554270.

*Primary Examiner* — Maria E Vazquez Colon
(74) *Attorney, Agent, or Firm* — Paratus Law Group, PLLC

(57) ABSTRACT

The present technology relates to an encoder and an encoding method, a decoder and a decoding method, and a program by which encoding efficiency is able to be improved by constraining an appearance probability of a predetermined quantization value of an encoding target to 0 when encoding with a combination of Huffman encoding and multidimensional encoding is performed.

8 Claims, 19 Drawing Sheets

Related U.S. Application Data continuation of application No. 14/363,456, filed as application No. PCT/JP2013/050208 on Jan. 9, 2013, now Pat. No. 9,754,599.

(51) Int. Cl.
| | | |
|---|---|---|
| *H04N 19/91* | (2014.01) | |
| *H04N 19/15* | (2014.01) | |
| *H04N 19/124* | (2014.01) | |
| *H04N 19/48* | (2014.01) | |
| *G10L 19/038* | (2013.01) | |
| *G10L 19/00* | (2013.01) | |

(52) U.S. Cl.
CPC ........... *H04N 19/124* (2014.11); *H04N 19/15* (2014.11); *H04N 19/48* (2014.11); *H04N 19/91* (2014.11); *G10L 19/0017* (2013.01)

(56) References Cited

FOREIGN PATENT DOCUMENTS

| JP | 11-032334 | 2/1999 |
|---|---|---|
| JP | 2001-082878 | 3/2001 |
| JP | 2011-082878 | 4/2011 |

| A/B | +1 | -1 | 0 |
|-----|----|----|---|
| +1  | (1)| (3)| (5)|
| -1  | (4)| (2)| (7)|
| 0   | (6)| (8)| (9)|

| A/B | +1 | -1 | 0 |
|-----|----|----|---|
| +1  |    |    | (5) |
| -1  |    |    | (7) |
| 0   | (6) | (8) | (9) |

ENCODER AND ENCODING METHOD, DECODER AND DECODING METHOD, AND PROGRAM

CROSS REFERENCE TO RELATED APPLICATIONS

This application is a continuation of U.S. patent application Ser. No. 15/680,332 (filed on Aug. 18, 2017), which is a continuation of U.S. patent application Ser. No. 14/363,456 (filed on Jun. 6, 2014 and issued as U.S. Pat. No. 9,754,599 on Sep. 5, 2017), which is a National Stage Patent Application of PCT International Patent Application No. PCT/JP2013/050208 (filed on Jan. 9, 2013) under 35 U.S.C. § 371, which claims priority to Japanese Patent Application No. 2012-006972 (filed on Jan. 17, 2012), which are all hereby incorporated by reference in their entirety.

TECHNICAL FIELD

The present technology relates to an encoder and an encoding method, a decoder and a decoding method, and a program. In particular, the present technology relates to an encoder and an encoding method, a decoder and a decoding method, and a program by which encoding efficiency is able to be improved by constraining an appearance probability of a predetermined quantization value of an encoding target to 0 when encoding with a combination of Huffman encoding and multidimensional encoding is performed.

BACKGROUND ART

In order to compress and extend acoustic and visual digital data, various encoders and decoders are devised and practically used. An example of a standard compression scheme of acoustic data includes a Moving Picture Experts Group Audio Layer-3 (MP3), and an example of a standard compression scheme of visual data includes Joint Photographic Experts Group (JPEG).

In addition, Huffman encoding is a representative encoding method. In the Huffman encoding, for example, an appearance probability of each quantization value of an encoding target is learned, and a code book which is prepared by allocating a variable length code having a code length according to the appearance probability with respect to each of the quantization values in which the appearance probability is not 0 is used to perform the encoding.

At this time, a variable length code which is shorter in code length as the appearance probability of the quantization value increases is allocated, and a variable length code which is longer in code length as the appearance probability of the quantization value decreases is allocated, thereby allowing encoding efficiency to be improved compared to a case where a fixed length code is allocated to the entire quantization value.

In addition, it is also possible to improve the encoding efficiency by multidimensionalizing the quantization value. For example, when the digital data is quantized to 3 values of −1, 0, and +1, the number of bits taken to perform fixed length encoding with respect to the quantization value is 2 bits. Accordingly, when 4 quantization values are encoded individually, the number of bits taken to perform the encoding is 8 (=2×4) bits. In this regard, when 4 quantization values are multidimensionalized and encoded as a whole, the number of patterns of the quantization value in encoding unit is 81 (=$3^4$), and the number of bits taken to perform the encoding is 7 bits.

Further, it is understood that more efficient encoding is able to be realized by combining the Huffman encoding and the multidimensional encoding. However, the code book becomes bigger as the number of dimensions of the multidimensional encoding increases.

In addition, in the encoding with the combination of the Huffman encoding and the multidimensional encoding, a method by which the encoding efficiency is further improved is also devised by studying the encoding in a case where the entire quantization values in encoding unit are 0 (for example, refer to PTL 1).

CITATION LIST

Patent Literature

PTL 1: Japanese Unexamined Patent Application Publication No. 2001-82878

SUMMARY OF INVENTION

Technical Problem

However, in the encoding with the combination of the Huffman encoding and the multidimensional encoding, it is not considered that the appearance probability of the predetermined quantization value of the encoding target is constrained to 0 in order to improve the encoding efficiency.

The present technology has been accomplished in consideration of this circumstance, and encoding efficiency is able to be improved by constraining an appearance probability of a predetermined quantization value of an encoding target to 0 when encoding with a combination of Huffman encoding and multidimensional encoding is performed.

Solution to Problem

An encoder according to a first aspect of the present technology includes a constraint unit which constrains an appearance probability of a predetermined quantization value of a signal to 0, and an encoding unit which performs encoding with respect to the quantization value of the signal constrained by the constraint unit, on the basis of a constraint code book which is a code book having a variable length code which is longer in code length as the appearance probability decreases allocated with respect to each of a plurality of quantization values other than the predetermined quantization value of a signal for learning corresponding to the signal, the appearance probability of the predetermined quantization value of the signal for learning being constrained to 0.

An encoding method and a program according to the first aspect of the present technology correspond to the encoder according to the first aspect of the present technology.

In the first aspect of the present technology, the appearance probability of the predetermined quantization value of the signal is constrained to 0, and the quantization value of the signal constrained by the constraint unit is encoded, on the basis of the constraint code book which is the code book having the variable length code which is longer in code length as the appearance probability decreases allocated with respect to each of the plurality of quantization values other than the predetermined quantization value of the signal for learning corresponding to the signal, and the appearance probability of the predetermined quantization value of the signal for learning is constrained to 0.

A decoder according to a second aspect of the present technology includes a reception unit which receives a quantization value of a signal as an encoding target in which an appearance probability of a predetermined quantization value is constrained to 0 and the quantization value is encoded on the basis of a constraint code book which is a code book having a variable length code which is longer in code length as the appearance probability decreases allocated with respect to each of a plurality of quantization values other than the predetermined quantization value of a signal for learning corresponding to the signal, the appearance probability of the predetermined quantization value of the signal for learning being constrained to 0, and a decoding unit which performs decoding with respect to the quantization value received by the reception unit, on the basis of the constraint code book.

A decoding method and a program according to the second aspect of the present technology correspond to the decoder according to the second aspect of the present technology.

In the second aspect of the present technology, the predetermined quantization value of the signal as the encoding target in which the appearance probability of the predetermined quantization value is constrained to 0 and the quantization value is encoded on the basis of the constraint code book which is the code book having the variable length code which is longer in code length as the appearance probability decreases allocated with respect to each of the plurality of quantization values other than the predetermined quantization value of the signal for learning corresponding to the signal, the appearance probability of the predetermined quantization value of the signal for learning being constrained to 0 is received, and the received quantization value is decoded on the basis of the constraint code book.

The encoder according to the first aspect and the decoder according to the second aspect may be independent devices, and may be internal blocks which constitute one device.

Advantageous Effects of Invention

According to the first aspect of the present technology, it is possible to improve the encoding efficiency by constraining the appearance probability of the predetermined quantization value of the encoding target to 0 when the encoding with the combination of the Huffman encoding and the multidimensional encoding is performed.

In addition, according to the second aspect of the present technology, it is possible to perform the decoding with respect to the code in which the encoding efficiency is improved by constraining the appearance probability of the predetermined quantization value of the encoding target to 0 when the encoding with the combination of the Huffman encoding and the multidimensional encoding is performed.

DESCRIPTION OF EMBODIMENTS

Premise of the Present Invention

First Configuration Example of Encoder as Premise of the Present Invention

Figure 1:
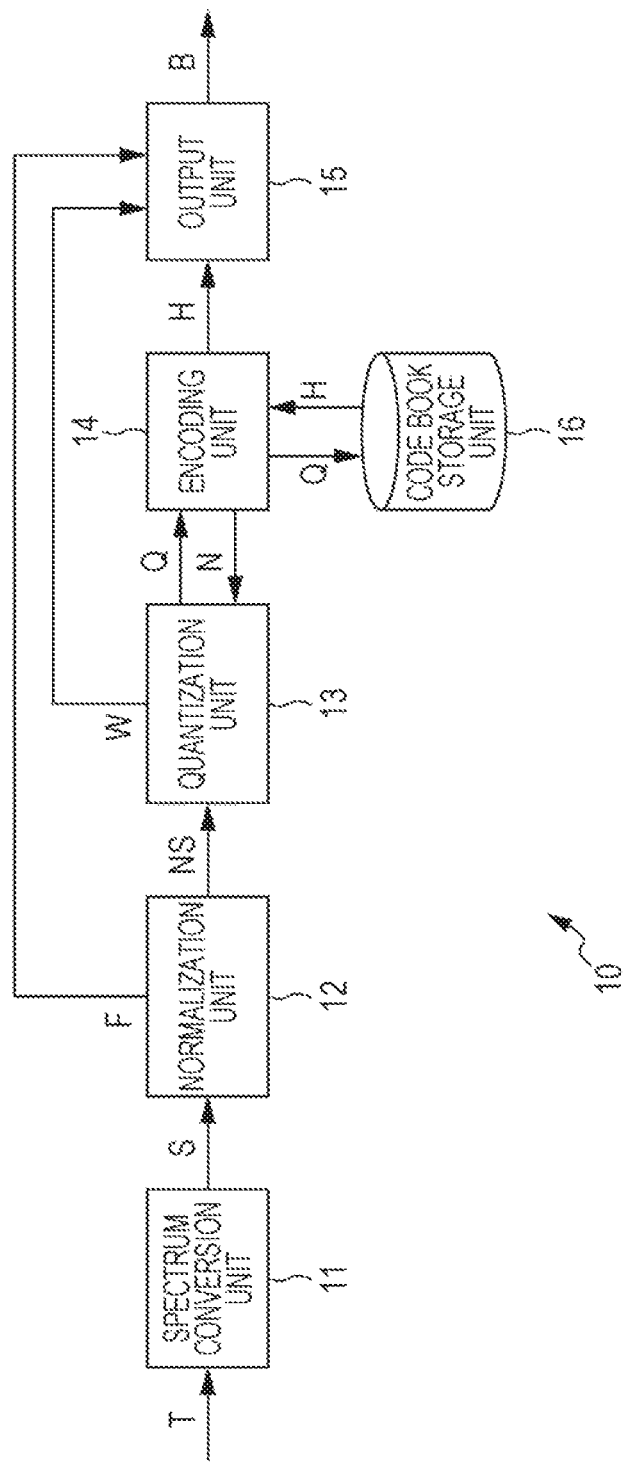
FIG. 1 is a block diagram illustrating a first configuration example of an encoder which is a premise of the present technology.

FIG. 1 is a block diagram illustrating a first configuration example of an encoder which is a premise of the present technology.

An encoder 10 of FIG. 1 includes a spectrum conversion unit 11, a normalization unit 12, a quantization unit 13, an encoding unit 14, an output unit 15, and a code book storage unit 16. The encoder 10 performs encoding with a combination of Huffman encoding and multidimensional encoding with respect to a time signal T of input acoustic data.

Specifically, the spectrum conversion unit 11 of the encoder 10 performs time-frequency conversion with respect to the time signal T input from outside, and converts the time signal T into a spectrum S. The spectrum conversion unit 11 supplies the spectrum S to the normalization unit 12.

The normalization unit 12 determines a normalization coefficient F showing an envelope of the spectrum S for each predetermined band, from the spectrum S supplied from the spectrum conversion unit 11, and supplies the normalization coefficient F to the output unit 15. In addition, the normalization unit 12 normalizes the spectrum S for each of the predetermined bands by using the normalization coefficient F, and supplies a normalized spectrum NS obtained therefor to the quantization unit 13.

The quantization unit 13 quantizes the normalized spectrum NS supplied from the normalization unit 12, on the basis of quantization information W showing the number of quantization bits as quantization accuracy, and supplies a quantization value Q obtained therefor to the encoding unit 14. At this time, the quantization unit 13 acquires the number of bits N fed back from the encoding unit 14 in response to the quantization value Q, and adjusts the quantization information W such that the number of bits N is a predetermined value. The quantization unit 13 supplies the quantization information W after being adjusted to the output unit 15.

The encoding unit 14 performs variable length encoding with respect to the quantization value Q supplied from the quantization unit 13. Specifically, the encoding unit 14 acquires a variable length code H corresponding to the quantization value Q from the code book storage unit 16 as an encoding result by supplying the quantization value Q to the code book storage unit 16.

In addition, the encoding unit 14 calculates a value as the number of bits N by adding the number of bits NH of the variable length code H, the number of bits NW of the quantization information W, and the number of bits NF of the normalization coefficient F, and supplies the value to the quantization unit 13. Accordingly, the quantization unit 13 adjusts the quantization information W such that the number of bits N is less than or equal to a value NQ which is determined as the number of bits of a code string B. When the number of bits N is less than or equal to the value NQ, the encoding unit 14 supplies the variable length code H corresponding to the quantization value Q to the output unit 15 as the encoding result.

The output unit 15 multiplexes the normalization coefficient F from the normalization unit 12, the quantization information W from the quantization unit 13, and the variable length code H from the encoding unit 14, and outputs the code string B obtained therefor.

The code book storage unit 16 stores a code book CB learned by a learning device (described later) in which a value acquired as the quantization value Q and the variable length code are associated with each other. When the quantization value Q is supplied from the encoding unit 14, the code book storage unit 16 reads out the variable length code H associated with the quantization value Q in the code book CB, and supplies the variable length code H to the encoding unit 14.

First Configuration Example of Decoder as Premise of the Present Invention

Figure 2:
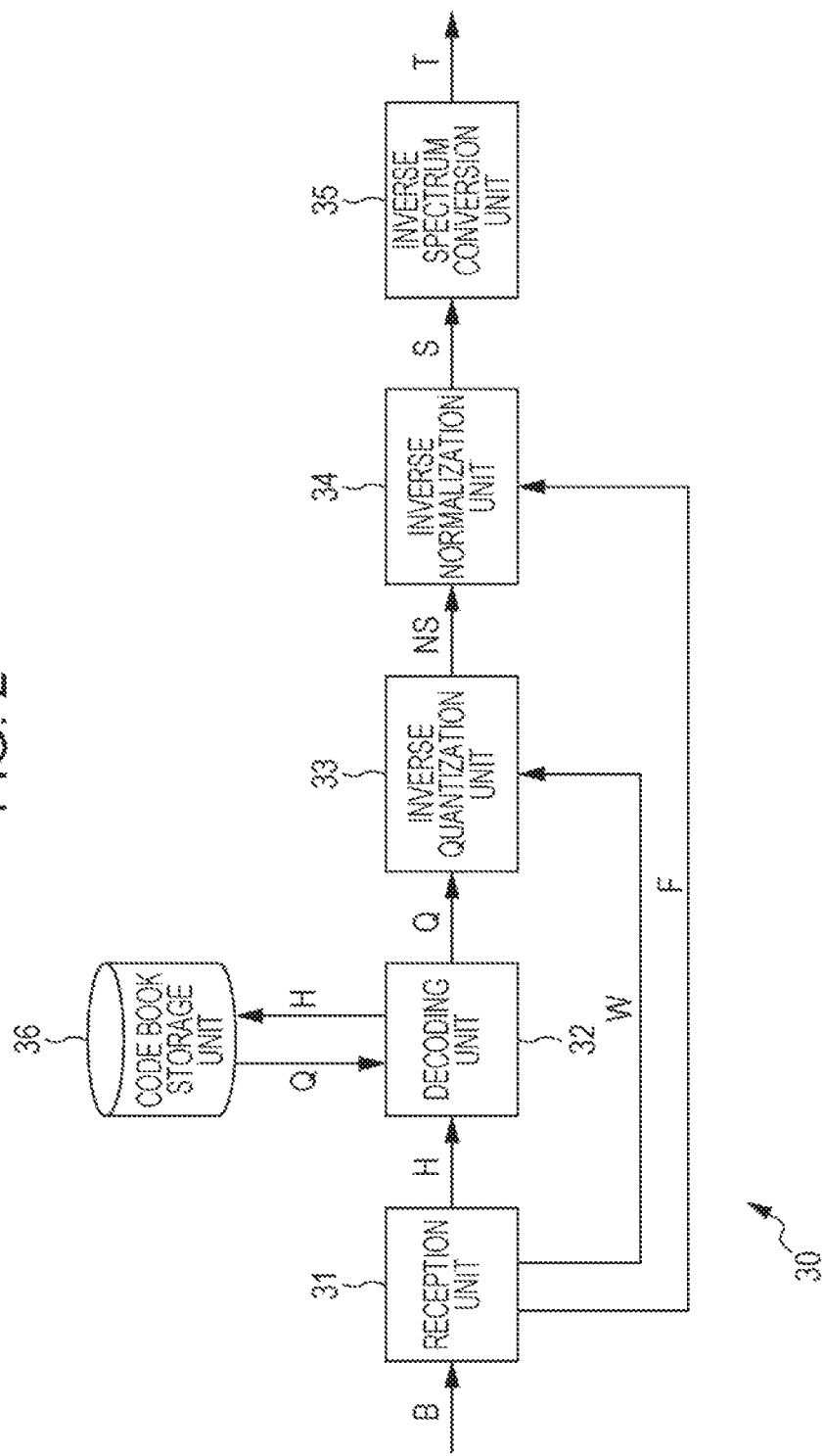
FIG. 2 is a block diagram illustrating a first configuration example of a decoder which is a premise of the present technology.

FIG. 2 is a block diagram illustrating a configuration example of a decoder which performs decoding with respect to the code string B output from the encoder 10 of FIG. 1.

A decoder 30 of FIG. 2 includes a reception unit 31, a decoding unit 32, an inverse quantization unit 33, an inverse normalization unit 34, an inverse spectrum conversion unit 35, and a code book storage unit 36.

The reception unit 31 of the decoder 30 receives the code string B output from the encoder 10 of FIG. 1. The reception unit 31 disassembles the code string B into the variable length code H, the quantization information W, and the normalization coefficient F. The reception unit 31 supplies the variable length code H to the decoding unit 32, supplies the quantization information W to the inverse quantization unit 33, and supplies the normalization coefficient F to the inverse normalization unit 34.

The decoding unit 32 performs the decoding with respect to the variable length code H supplied from the reception unit 31. Specifically, the decoding unit 32 supplies the variable length code H to the code book storage unit 36, thereby acquiring the quantization value Q corresponding to the variable length code H as a decoding result. The decoding unit 32 supplies the quantization value Q to the inverse quantization unit 33 as the decoding result.

The inverse quantization unit 33 inversely quantizes the quantization value Q supplied from the decoding unit 32, on the basis of the quantization information W supplied from the reception unit 31, thereby obtaining the normalized spectrum NS. The inverse quantization unit 33 supplies the normalized spectrum NS to the inverse normalization unit 34.

The inverse normalization unit 34 inversely normalizes the normalized spectrum NS supplied from the inverse quantization unit 33 for each of the predetermined bands, by using the normalization coefficient F supplied from the reception unit 31, and supplies the frequency spectrum S obtained therefor to the inverse spectrum conversion unit 35.

The inverse spectrum conversion unit 35 performs frequency-time conversion with respect to the frequency spectrum S supplied from the inverse normalization unit 34, and outputs the time signal T obtained therefor.

The code book storage unit 36 stores a code book CB identical to the code book CB stored in the code book storage unit 16. When the variable length code H is supplied from the decoding unit 32, the code book storage unit 36 reads out the quantization value Q associated with the variable length code H in the code book CB, and supplies the quantization value Q to the decoding unit 32.

Furthermore, the normalized spectrum NS, the frequency spectrum S, and the time signal T of the decoder 30 include an error according to the quantization, and thus do not completely coincide with the normalized spectrum NS, the frequency spectrum S, and the time signal T of the encoder 10.

Figure 3:
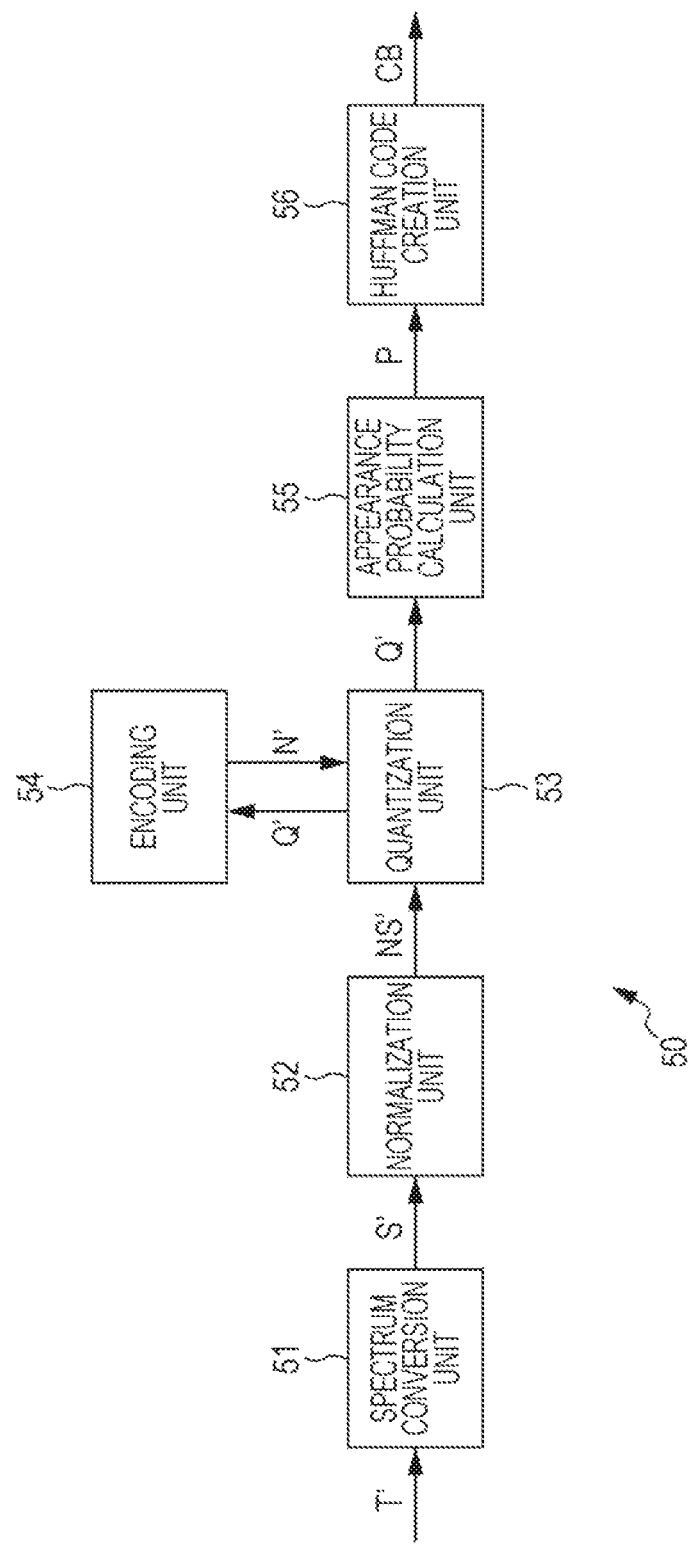
FIG. 3 is a block diagram illustrating a first configuration example of a learning device which is a premise of the present technology.

First Configuration Example of Learning Device as Premise of the Present Invention FIG. 3 is a block diagram illustrating a configuration example of a learning device for learning the code book CB stored in the code book storage unit 16 of FIG. 1 and the code book storage unit 36 of FIG. 2.

A learning device 50 of FIG. 3 includes a spectrum conversion unit 51, a normalization unit 52, a quantization unit 53, an encoding unit 54, an appearance probability calculation unit 55, and a Huffman code creation unit 56.

A time signal T' for learning corresponding to the time signal T which is input into the encoder 10 of FIG. 1 as an encoding target is input into the spectrum conversion unit 51 of the learning device 50. The spectrum conversion unit 51 performs the time-frequency conversion with respect to the time signal T' for learning, similar to the spectrum conversion unit 11 of FIG. 1, and converts the time signal T' into a spectrum S'. The spectrum conversion unit 51 supplies the spectrum S' to the normalization unit 52.

The normalization unit 52 determines a normalization coefficient F' of the spectrum S' for each of the predetermined bands, from the spectrum S' supplied from the spectrum conversion unit 51, similar to the normalization unit 12. In addition, the normalization unit 12 normalizes the spectrum S' for each of the predetermined bands, by using the normalization coefficient F', and supplies a normalized spectrum NS' obtained therefor to the quantization unit 53.

The quantization unit 53 quantizes the normalized spectrum NS' supplied from the normalization unit 52, on the basis of quantization information W', and supplies a quantization value Q' obtained therefor to the encoding unit 54, similar to the quantization unit 13. At this time, the quantization unit 53 acquires the number of bits N' fed back from the encoding unit 54 in response to the quantization value Q', and adjusts the quantization information W' such that the number of bits N' is a predetermined value, similar to the quantization unit 13. The quantization unit 53 supplies the final quantization value Q' to the appearance probability calculation unit 55.

The encoding unit 54 performs fixed length encoding with respect to the quantization value Q' supplied from the quantization unit 53. The encoding unit 54 calculates a value as the number of bits N' by adding the number of bits NH' of the fixed length code, the number of bits NW' of the quantization information W', and the number of bits NF' of the normalization coefficient F', and supplies the value to the quantization unit 53. Accordingly, the quantization unit 53 adjusts the quantization information W' such that the number of bits N' is less than or equal to a value corresponding to a bit rate of a set code string. When a code book CB corresponding to an encoding scheme such as MP3, Advanced Audio Coding (AAC), or Adaptive Transform Acoustic Coding (ATRAC) is prepared, the bit rate of the code string is approximately 128 kbps, at which a sufficient acoustic quality is able to be secured.

The appearance probability calculation unit 55 sets a value acquired as the quantization value Q' (the quantization value Q) as an entry on the basis of the quantization value Q' supplied from the quantization unit 53, and counts the number of appearances for each of the entries. The appearance probability calculation unit 55 supplies the number of appearances for each of the entries of the entire time signal T' to the Huffman code creation unit 56, as an appearance probability P of each of the entries.

The Huffman code creation unit 56 allocates the variable length code which is longer in code length as the appearance probability P decreases with respect to the quantization value which Is each of the entries, on the basis of the appearance probability P of each of the entries supplied from the appearance probability calculation unit 55. The Huffman code creation unit 56 prepares the code book CB in which the respective quantization values and the variable length code allocated to the quantization value are associated with each other. The code book CB is stored in the code book storage unit 16 and the code book storage unit 36.

Description of Code Book CB

Figures 4, 5:
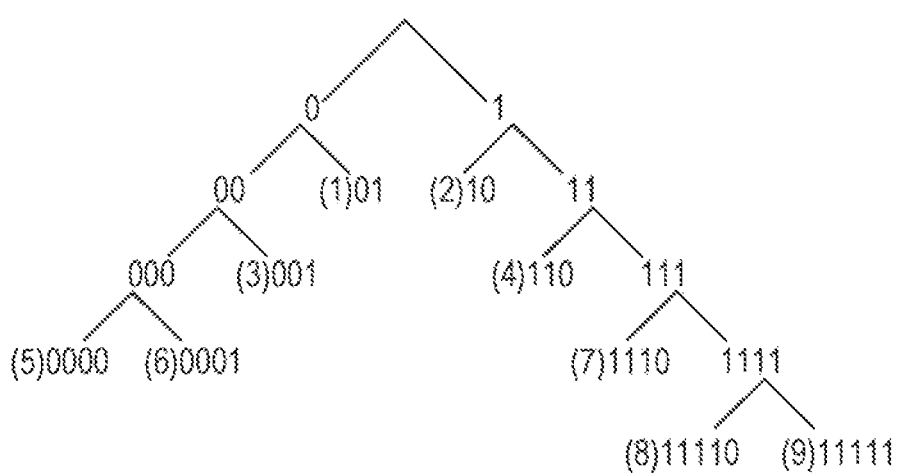
FIG. 4 is a diagram illustrating an example of a value acquired as a quantization value Q' (a quantization value Q).
FIG. 5 is a diagram illustrating an example of a variable length code which is allocated in a code book CB.

FIG. 4 is a diagram illustrating an example of a value acquired as the quantization value Q' (the quantization value Q).

In the example of FIG. 4, the encoding is in 2 dimensions, and the respective quantization values Q' (the quantization values Q) of two spectra which are the encoding targets are set as A and B, respectively. In addition, in the example of FIG. 4, the acquired values of the quantization values A and B are 3 values of −1, 0, and +1, respectively.

In this case, the acquired combination of the quantization values (A, B) is (1, 1), (1, −1), (1, 0), (−1, 1), (−1, −1), (−1, 0), (0, 1), (0, −1), and (0, 0). That is, the number of entries is 9 (=$3^2$) of (1) to (9) illustrated in FIG. 4.

FIG. 5 is a diagram illustrating an example of the variable length code allocated to each of the entries (1) to (9) of FIG. 4, in the code book CB.

Furthermore, in the example of FIG. 5, the appearance probability is high in order of an entry (1), an entry (2), an entry (3), an entry (4), an entry (5), an entry (6), an entry (7), an entry (8), and an entry (9).

In this case, as illustrated in FIG. 5, for example, a code "01" of 2 bits is allocated to the quantization value of the entry (1), and a code "10" of 2 bits is allocated to the quantization value of the entry (2). In addition, a code "001" of 3 bits is allocated to the quantization value of the entry (3), and a code "110" of 3 bits is allocated to the quantization value of the entry (4).

Further, a code "0000" of 4 bits is allocated to the quantization value of the entry (5), a code "0001" of 4 bits is allocated to the quantization value of the entry (6), and a code "1110" of 4 bits is allocated to the quantization value of the entry (7). In addition, a code "11110" of 5 bits is allocated to the quantization value of the entry (8), and a code "11111" of 5 bits is allocated to the quantization value of the entry (9).

As described above, in the code book CB of FIG. 5, the code of 5 bits is allocated to the quantization value in which the appearance probability is the lowest, and the code of 2 bits is allocated to the quantization value in which the appearance probability is the highest. In this regard, when the two-dimensional fixed length encoding is performed with respect to the quantization value Q' (the quantization value Q), the number of bits of the fixed length code is always 4 bits in which 9 patterns are able to be shown. Accordingly, when the variable length encoding is performed on the basis of the code book CB of FIG. 5, it is possible to improve the encoding efficiency compared to a case where the fixed length encoding is performed.

Description of Process of Learning Device

Figure 6:
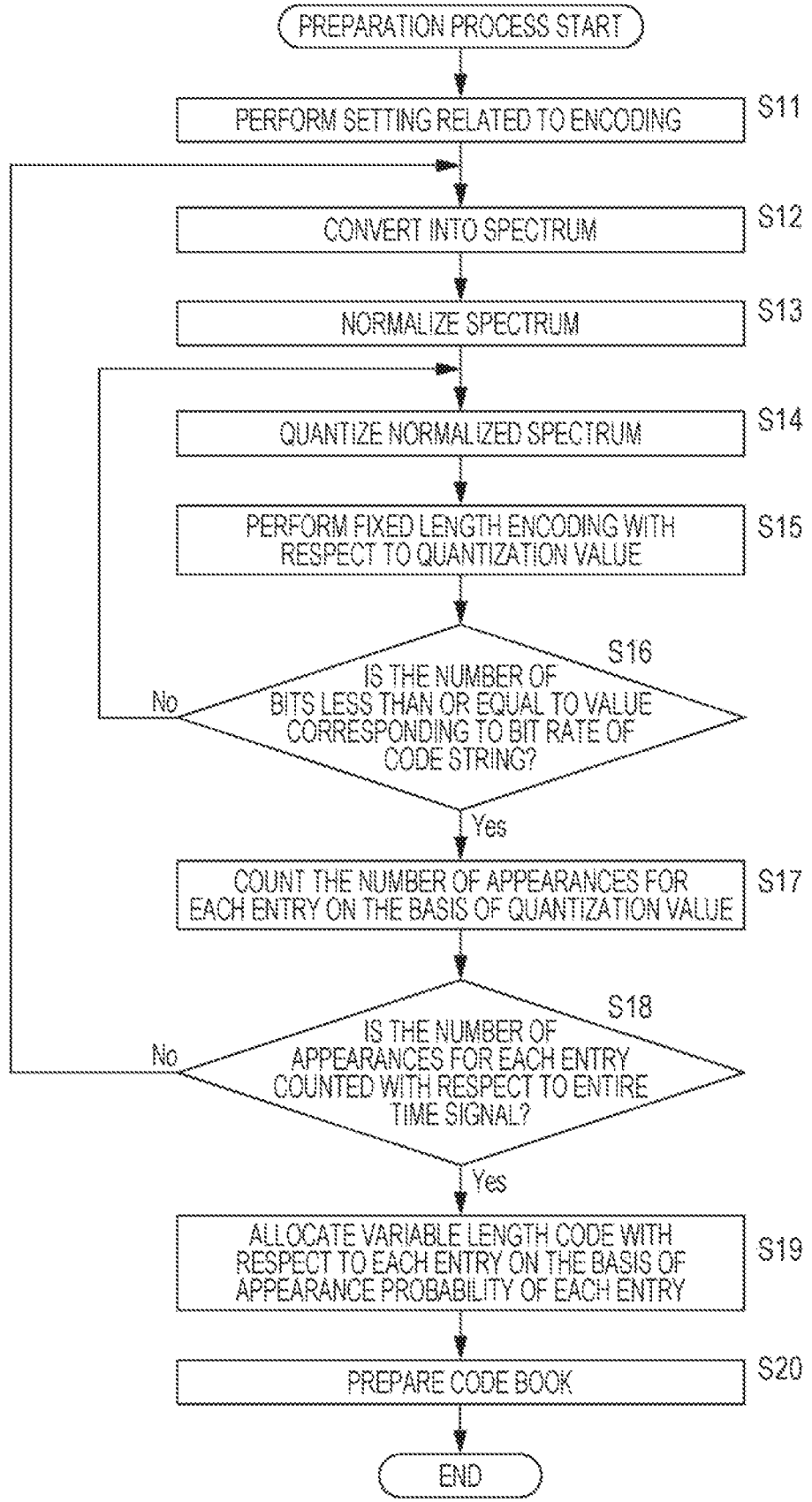
FIG. 6 is a flowchart for describing a preparation process of the learning device of FIG. 3.

FIG. 6 is a flowchart for describing a preparation process of the learning device 50 of FIG. 3.

In Step S11 of FIG. 6, the learning device 50 performs setting related to the encoding. Specifically, for example, the encoding unit 54 of the learning device 50 sets an encoding mode to a fixed length encoding mode. In addition, the quantization unit 53 sets the bit rate of the code string to a predetermined value (for example, 128 kbps).

In Step S12, the spectrum conversion unit 51 of the learning device 50 performs the time-frequency conversion with respect to the time signal T' for learning input from the outside, and converts the time signal T' to the spectrum S'. The spectrum conversion unit 51 supplies the spectrum S' to the normalization unit 52.

In Step S13, the normalization unit 52 determines the normalization coefficient F of the spectrum S' for each of the predetermined bands, from the spectrum S' supplied from the spectrum conversion unit 51, and normalizes the spectrum S' by using the normalization coefficient F. The normalization unit 52 supplies the normalized spectrum NS' obtained therefor to the quantization unit 53.

In Step S14, the quantization unit 53 quantizes the normalized spectrum NS' supplied from the normalization unit 52, on the basis of the quantization information W', and supplies the quantization value Q' obtained therefor to the encoding unit 54.

In Step S15, the encoding unit 54 performs the fixed length encoding with respect to the quantization value Q' supplied from the quantization unit 53. The encoding unit 54 calculates a value as the number of bits N' by adding the number of bits NH' of the fixed length code, the number of bits NW' of the quantization information W', and the number of bits NF' of the normalization coefficient F', and supplies the value to the quantization unit 53.

In Step S16, the quantization unit 53 determines whether or not the number of bits N' is less than or equal to the value corresponding to the bit rate of the set code string. In Step S16, when the number of bits N' is not less than or equal to the value corresponding to the bit rate of the set code string, the quantization unit 53 changes the quantization information W'. Then, the process returns to Step S14, and the processes of Steps S14 to S16 are repeated until the number of bits N' is less than or equal to the value corresponding to the bit rate of the set code string.

On the other hand, in Step S16, when the number of bits N' is less than or equal to the value corresponding to the bit rate of the set code string, the quantization unit 53 supplies the quantization value Q' to the appearance probability calculation unit 55.

Then, in Step S17, the appearance probability calculation unit 55 sets the value acquired as the quantization value Q' (the quantization value Q) as the entry, on the basis of the quantization value Q' supplied from the quantization unit 53, and counts the number of appearances for each of the entries.

In Step 318, the learning device 50 determines whether or not the number of appearances for each of the entries is counted with respect to the entire time signal T'. In Step S18, when the number of appearances for each of the entries is not yet counted with respect to the entire time signal T', the process returns to Step S12, and the processes of Steps S12 to S18 are repeated.

On the other hand, in Step S18, when the number of appearances for each of the entries is counted with respect to the entire time signal T', the appearance probability calculation unit 55 supplies the number of appearances for each of the entries with respect to the entire time signal T' to the Huffman code creation unit 56, as the appearance probability P of each of the entries.

Then, in Step S19, the Huffman code creation unit 56 allocates the variable length code which is longer in code length as the appearance probability P decreases with respect to the quantization value which is each of the entries, on the basis of the appearance probability P of each of the entries supplied from the appearance probability calculation unit 55.

In Step S20, the Huffman code creation unit 56 prepares the code book CB in which the respective quantization values and the variable length code allocated to the quantization value are associated with each other. The code book CB is stored in the code book storage unit 16 and the code book storage unit 36.

The learning device 50 is able to learn a more accurate appearance probability by using a lot of acoustic time signals as the time signal T' for learning. As a result, it is possible to prepare a more suitable code book.

Second Configuration Example of Encoder as Premise of the Present Invention

Figure 7:
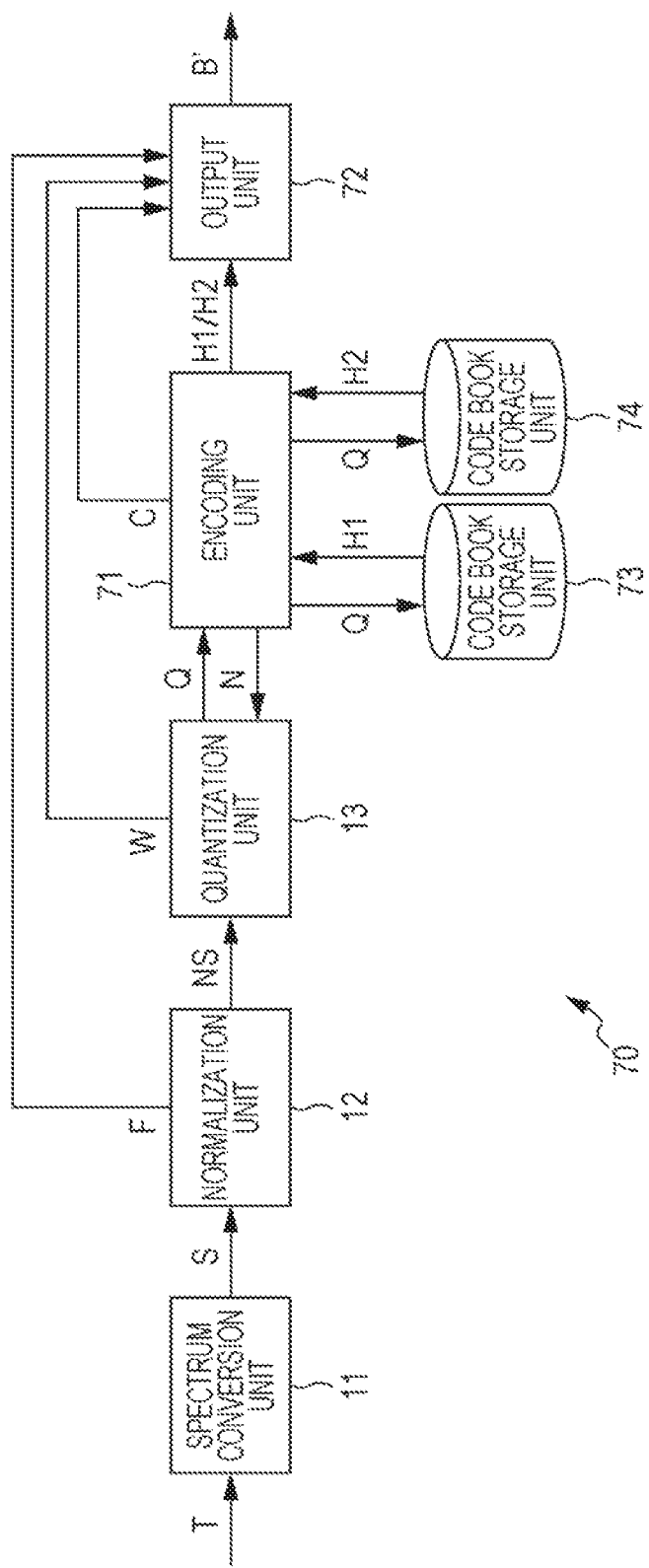
FIG. 7 is a block diagram illustrating a second configuration example of the encoder which is a premise of the present technology.

FIG. 7 is a block diagram illustrating a second configuration example of the encoder which is a premise of the present technology.

Among configurations illustrated in FIG. 7, the same reference numerals are applied to the same configurations as those of FIG. 1. The repeated description thereof will be properly omitted.

A configuration of an encoder 70 of FIG. 7 is different from the configuration of FIG. 1 in that an encoding unit 71, an output unit 72, a code book storage unit 73, and a code book storage unit 74 are provided instead of the encoding unit 14, the output unit 15, and the code book storage unit 16. The encoder 70 performs the encoding by selectively using two types of code books.

Specifically, the encoding unit 71 of the encoder 70 performs the encoding with respect to the quantization value Q supplied from the quantization unit 13. More specifically, the encoding unit 71 supplies the quantization value Q to the code book storage unit 73, thereby acquiring a variable length code H1 corresponding to the quantization value Q from the code book storage unit 73. In addition, the encoding unit 71 supplies the quantization value Q to the code book storage unit 74, thereby acquiring a variable length code H2 corresponding to the quantization value Q from the code book storage unit 74.

The encoding unit 71 sets one having a small number of bits among the variable length code H1 and the variable length code H2 as the encoding result. Similar to the encoding unit 14 of FIG. 1, the encoding unit 71 supplies the number of bits N to the quantization unit 13, on the basis of the number of bits of the encoding result or the like. When the number of bits N is less than or equal to the value NQ, the encoding unit 71 supplies the variable length code H1 or the variable length code H2 which is the encoding result corresponding to the quantization value Q to the output unit 72. In addition, the encoding unit 71 supplies code book information C showing a code book corresponding to the variable length code H1 or the variable length code H2 selected as the encoding result as the code book used in the encoding to the output unit 72.

The output unit 72 multiplexes the normalization coefficient F from the normalization unit 12, the quantization information W from the quantization unit 13, and the variable length code H1 or the variable length code H2 and the code book information C from the encoding unit 71, and outputs a code string B' obtained therefor.

The code book storage unit 73 stores a code book CB1 in which the value acquired as the quantization value Q and the variable length code are associated with each other and which is learned by using a predetermined time signal for learning by the learning device (described later). When the quantization value Q is supplied from the encoding unit 71, the code book storage unit 73 reads out the variable length code H1 associated with the quantization value Q in the code book CB1, and supplies the variable length code H1 to the encoding unit 71.

The code book storage unit 74 stores a code book CB2 in which the value acquired as the quantization value Q and the variable length code are associated with each other and which is learned by using a time signal for learning different from the time signal for learning used in preparing the code book CB1 by the learning device (described later). When the quantization value Q is supplied from the encoding unit 71, the code book storage unit 74 reads out the variable length code H2 associated with the quantization value Q in the code book CB2, and supplies the variable length code H2 to the encoding unit 71.

Second Configuration Example of Decoder as Premise of the Present Invention

Figure 8:
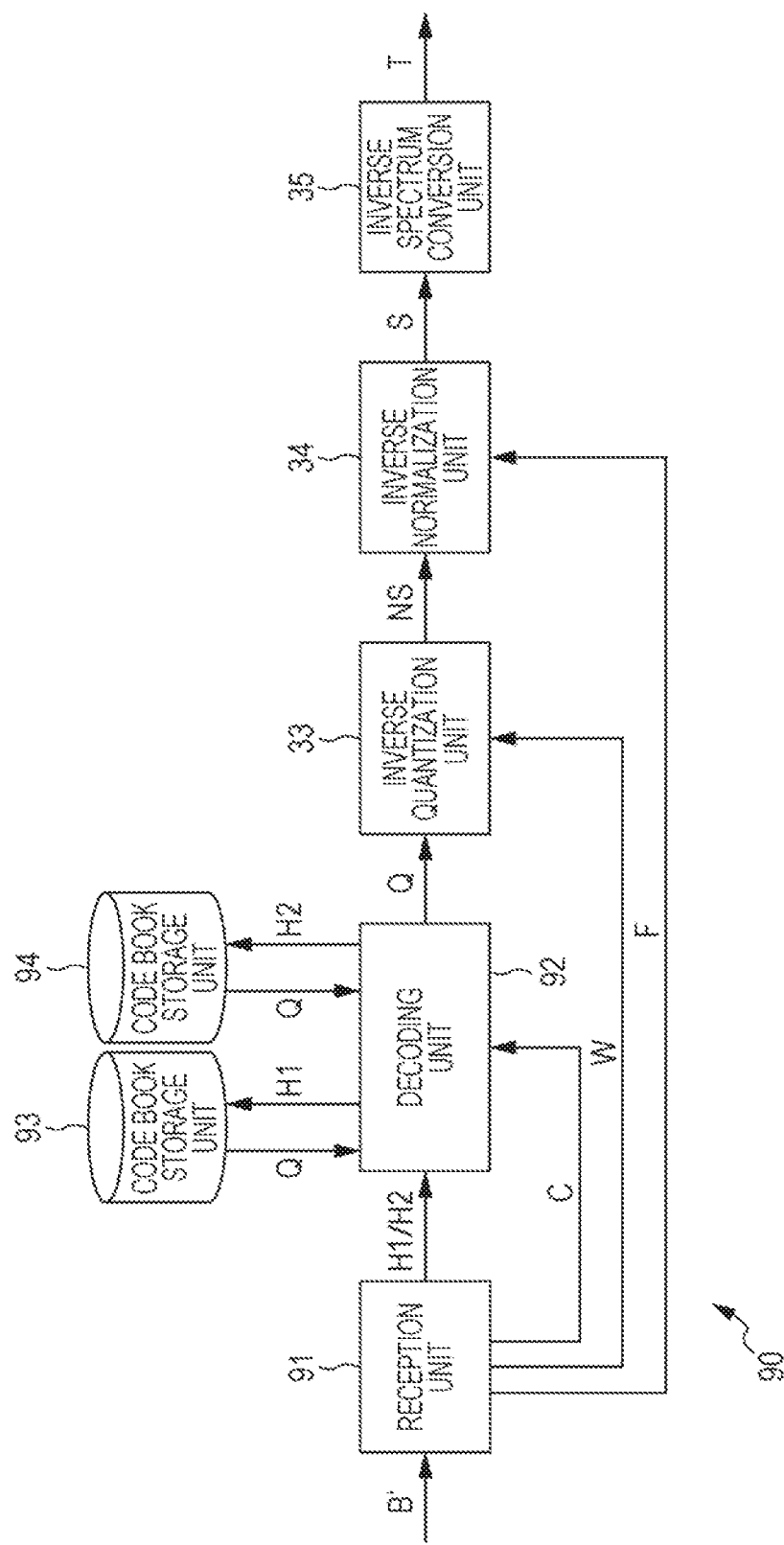
FIG. 8 is a block diagram illustrating a second configuration example of the decoder which is a premise of the present technology.

FIG. 8 is a block diagram illustrating a configuration example of the decoder for decoding the code string B' output from the encoder 70 of FIG. 7.

Among configurations illustrated in FIG. 8, the same reference numerals are applied to the same configurations as those of FIG. 2. The repeated description thereof will be properly omitted.

A configuration of a decoder 90 of FIG. 8 is different from the configuration of FIG. 2 in that a reception unit 91, a decoding unit 92, a code book storage unit 93, and a code book storage unit 94 are provided instead of the reception unit 31, the decoding unit 32, and the code book storage unit 36.

The reception unit 91 of the decoder 90 receives the code string B' output from the encoder 70 of FIG. 7. The reception unit 91 disassembles the code string B' into the variable length code H1 or H2, the code book information C, the quantization information W, and the normalization coefficient F. The reception unit 91 supplies the variable length code H1 or H2 and the code book information C to the decoding unit 92, supplies the quantization information W to the inverse quantization unit 33, and supplies the normalization coefficient F to the inverse normalization unit 34.

The decoding unit 92 performs the decoding with respect to the variable length code H1 or H2 supplied from the reception unit 91, on the basis of the code book information C supplied from the reception unit 91. Specifically, the decoding unit 92 selects the code book storage unit 93 for storing the code book CB1 shown by the code book information C or the code book storage unit 94 for storing the code book CB2 shown by the code book information C. The decoding unit 92 acquires the quantization value Q corresponding to the variable length code H1 by supplying the variable length code H1 to the selected code book storage unit 93, or acquires the quantization value Q corresponding to the variable length code H2 by supplying the variable length code H2 to the selected code book storage unit 94. The decoding unit 92 supplies the acquired quantization value Q to the inverse quantization unit 33 as the decoding result.

The code book storage unit 93 stores a code book CB1 identical to the code book CB1 stored in the code book storage unit 73 of FIG. 7. When the variable length code H1 is supplied from the decoding unit 92, the code book storage unit 93 reads out the quantization value Q associated with the variable length code H1 in the code book CB1, and supplies the quantization value Q to the decoding unit 92.

The code book storage unit 94 stores a code book CB2 identical to the code book CB2 stored in the code book storage unit 74. When the variable length code H2 is supplied from the decoding unit 92, the code book storage unit 94 reads out the quantization value Q associated with the variable length code 12 in the code book CB2, and supplies the quantization value Q to the decoding unit 92.

Furthermore, the normalized spectrum NS, the frequency spectrum S, and the time signal T of the decoder 90 include an error according to the quantization, and thus do not completely coincide with the normalized spectrum NS, the frequency spectrum S, and the time signal T of the encoder 70.

Figure 9:
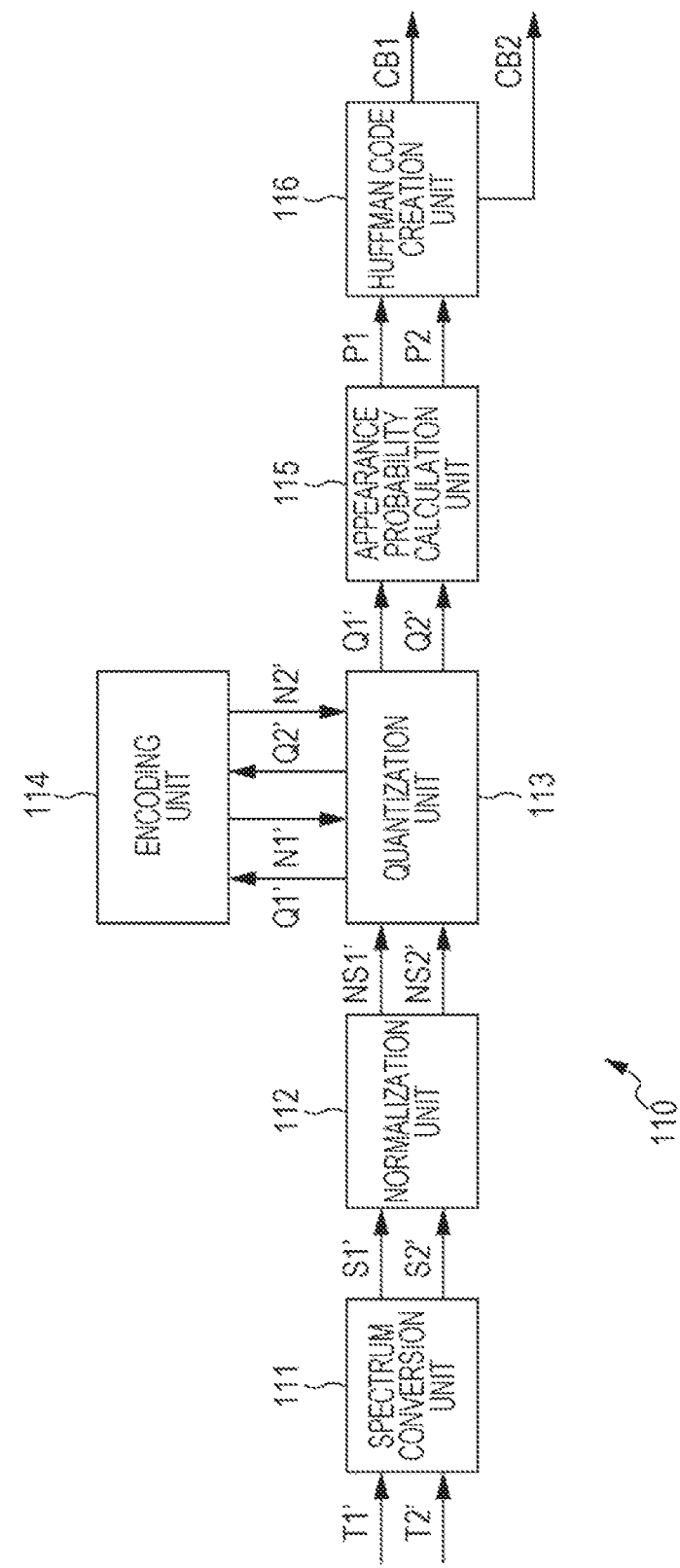
FIG. 9 is a block diagram illustrating a second configuration example of the learning device which is a premise of the present technology.

Second Configuration Example of Learning Device as Premise of the Present Invention FIG. 9 is a block diagram illustrating a configuration example of the learning device for learning the code book CB1 stored in the code book storage unit 73 of FIG. 7 and the code book storage unit 93 of FIG. 8, and for learning the code book CB2 stored in the code book storage unit 74 and the code book storage unit 94.

A learning device 110 of FIG. 9 includes a spectrum conversion unit 111, a normalization unit 112, a quantization unit 113, an encoding unit 114, an appearance probability calculation unit 115, and a Huffman code creation unit 116. Two types of time signals T1' and T2' for learning corresponding to the time signal T which is input into the encoder 70 of FIG. 7 as the encoding target are input into the learning device 110. The time signal T1' and the time signal T2', for example, are time signals in which distribution of the appearance probability of each of the entries is different from each other.

The processes of the spectrum conversion unit 111, the normalization unit 112, the quantization unit 113, the encoding unit 114, the appearance probability calculation unit 115, and the Huffman code creation unit 116 of the learning device 110 are the same as the processes of the spectrum conversion unit 51, the normalization unit 52, the quantization unit 53, the encoding unit 54, the appearance probability calculation unit 55, and the Huffman code creation unit 56 of FIG. 3, except that a target of the process is not the time signal T' but the time signals T1' and T2'.

Specifically, in the spectrum conversion unit ill, the time signal T1' and the time signal T2' are converted into spectra S1' and S2'; in the normalization unit 112, normalized spectra NS1' and NS2' are created; and in the quantization unit 113, quantization values Q1' and Q2' are created. Then, in the encoding unit 114, the fixed length encoding is performed with respect to the quantization values Q1' and Q2', and in the quantization unit 113, quantization information W1' and quantization information W2' are adjusted.

The appearance probability calculation unit 115 sets the value acquired as the quantization value Q' (the quantization value Q) as the entry on the basis of the quantization value Q1', and counts the number of appearances for each of the entries. Then, the appearance probability calculation unit 115 sets the number of appearances for each of the entries of the entire time signal T1' as an appearance probability P1' of each of the entries to supply to the Huffman code creation unit 116.

In addition, as the same applies to the quantization value Q2', the appearance probability calculation unit 115 counts the number of appearances for each of the entries, and sets the number of appearances for each of the entries of the entire time signal T2' as an appearance probability P2' of each of the entries to supply to the Huffman code creation unit 116.

The Huffman code creation unit 116 allocates the variable length code which is longer in code length as the appearance probability P1' decreases with respect to the quantization value which is each of the entries, on the basis of the appearance probability P1' of each of the entries supplied from the appearance probability calculation unit 115, and prepares the code book CB1. The code book CB1 is stored in the code book storage unit 73 of FIG. 7 and the code book storage unit 93 of FIG. 8.

In addition, as the same applies to the appearance probability P2' of each of the entries supplied from the appearance probability calculation unit 115, the Huffman code creation unit 116 allocates the variable length code which is longer in code length as the appearance probability P2' decreases with respect to the quantization value which is each of the entries, and prepares the code book CB2. The code book CB2 is stored in the code book storage unit 74 of FIG. 7 and the code book storage unit 94 of FIG. 8.

Furthermore, the learning device 110 may perform the process with respect to the time signal T1' and the process with respect to the time signal T2' in parallel, or may perform the processes in a temporally shifted manner.

Description of Code Book CB1 and Code Book CB2

Figure 10:
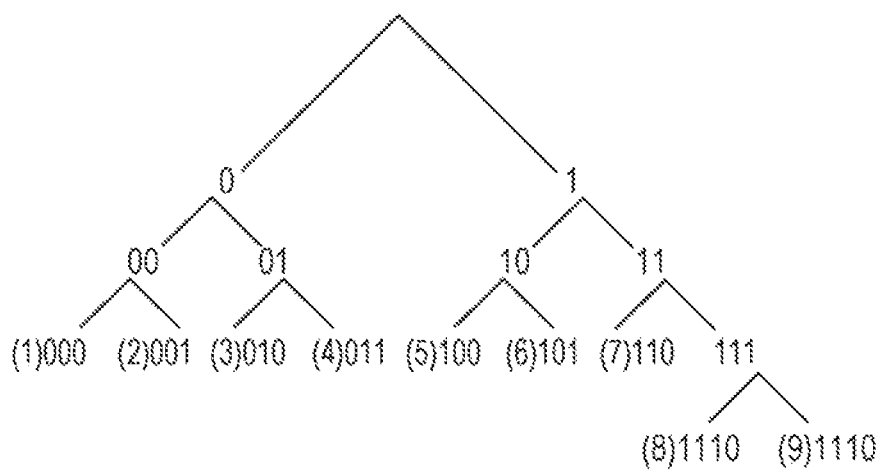
FIG. 10 is a diagram illustrating an example of a variable length code which is allocated in a code book CB1.
Figure 11:
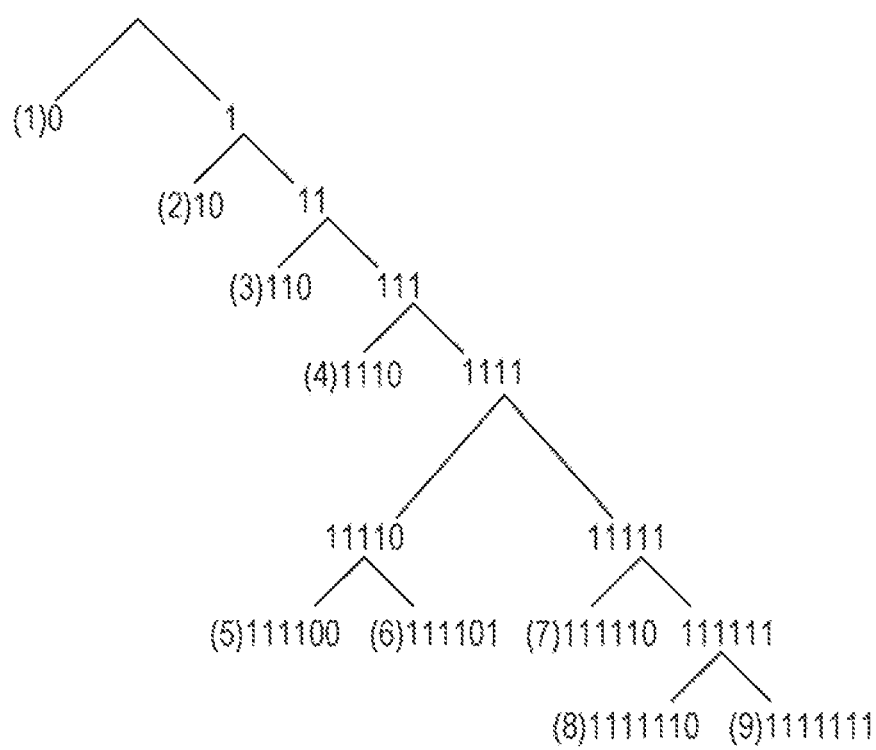
FIG. 11 is a diagram illustrating an example of a variable length code which is allocated in a code book CB2.

FIG. 10 is a diagram illustrating an example of the variable length code allocated to each of the entries (1) to (9) of FIG. 4 in the code book CB1, and FIG. 11 is a diagram illustrating an example of the variable length code allocated to each of the entries (1) to (9) of FIG. 4 in the code book CB2.

Furthermore, in the example of FIG. 10, the appearance probabilities of the entry (1) to the entry (8) are substantially identical to each other, and the appearance probability of the entry (9) is low compared to the appearance probabilities of the other entries.

In this case, as illustrated in FIG. 10, for example, the codes "000", "001", "010", "011", "100", "101", and "110" of 3 bits are allocated to the quantization values of the entry (1) to entry (7), respectively. In addition, the code "1110" of 4 bits is allocated to the quantization value of the entry (8), and the code "1110" of 4 bits is allocated to the quantization value of the entry (9).

Thus, in the code book CB1 of FIG. 10, the code of 4 bits is allocated to two quantization values including the quantization value in which the appearance probability is the lowest, and the code of 3 bits is allocated to the quantization value in which the appearance probability is the highest. Accordingly, when the variable length encoding is performed on the basis of the code book CB1 of FIG. 10, it is possible to improve the encoding efficiency compared to a case where the fixed length encoding in which the number of bits of the code is always 4 bits is performed.

In addition, in the example of FIG. 11, the appearance probability is high in order of the entry (1), the entry (2), the entry (3), and the entry (4), and the appearance probabilities of the entry (5) to the entry (9) are substantially identical to each other and considerably lower than the appearance probability of the entry (4).

In this case, as illustrated in FIG. 11, for example, the code "0" of 1 bit is allocated to the quantization value of the entry (1), and the code "10" of 2 bits is allocated to the quantization value of the entry (2). In addition, the code "110" of 3 bits is allocated to the quantization value of the entry (3), and the code "1110" of 4 bits is allocated to the quantization value of the entry (4).

Further, the code "111100" of 6 bits is allocated to the quantization value of the entry (5), the code "111101" of 6 bits is allocated to the quantization value of the entry (6), and the code "111110" of 6 bits is allocated to the quantization value of the entry (7). In addition, the code "1111110" of 7 bits is allocated to the quantization value of the entry (8), and the code "1111111" of 7 bits is allocated to the quantization value of the entry (9).

Thus, in the code book CB2 of FIG. 11, the code of the code length of 7 bits is allocated to two quantization values in which the appearance probability is the lowest, and the code of the code length of 1 bit is allocated to the quantization value in which the appearance probability is the highest. Accordingly, when the variable length encoding is performed on the basis of the code book CB2, it is possible to probabilistically improve the encoding efficiency compared to a case where the fixed length encoding in which the number of bits of the code is always 4 bits is performed.

As illustrated in FIG. 10 and FIG. 11, the code length applied to each of the entries is different according to the distribution of the appearance probability of each of the entries. Accordingly, the learning device 110 separately prepares the code books CB1 and CB2 by using the time signals T1' and T2' in which the distribution of the appearance probability of each of the entries is different from each other, thereby providing a suitable code book according to the time signals T1' and T2'. As a result, it is possible for the encoder 70 to selectively use the suitable code book according to the time signal T1' or T2' corresponding to the time signal T and perform the encoding with respect to the time signal T, thereby allowing the encoding efficiency to be improved.

The number of code books is not limited to 2, and it is not possible to prepare an infinite number of code books, so that the number of code books is determined in consideration of the encoding efficiency and practicality.

First Embodiment

Configuration Example According to First Embodiment of Encoder

Figure 12:
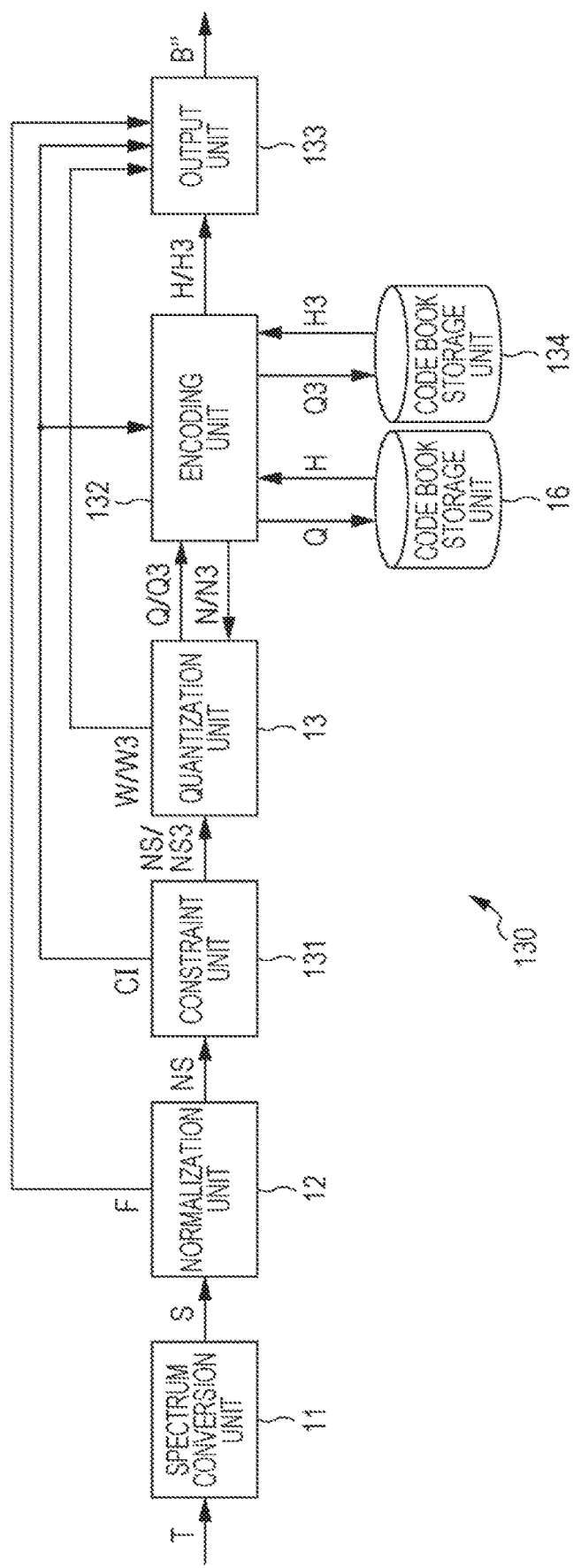
FIG. 12 is a block diagram illustrating a configuration example according to an embodiment of the encoder to which the present technology is applied.

FIG. 12 is a block diagram illustrating a configuration example according to a first embodiment of the encoder to which the present technology is applied.

Among configurations illustrated in FIG. 12, the same reference numerals are applied to the same configurations as those of FIG. 1. The repeated description thereof will be properly omitted.

A configuration of an encoder 130 of FIG. 12 is different from the configuration of FIG. 1 in that an encoding unit 132 and an output unit 133 are provided instead of the encoding unit 14 and the output unit 15, and a constraint unit 131 and a code book storage unit 134 are newly provided. When a bit rate of a code string B" is less than a predetermined value, the encoder 130 performs the encoding by constraining the appearance probability of the predetermined quantization value to 0.

Specifically, when the bit rate of the code string B" is less than the predetermined value, the constraint unit 131 of the encoder 130 constrains the appearance probability of the predetermined quantization value of the normalized spectrum NS of an unimportant band among the normalized spectra NS for each of the predetermined bands obtained by the normalization unit 12 to 0.

More specifically, on the basis of a maximum value of a level of normalized spectrum NS (a spectrum group) for each of the predetermined bands, when the maximum value is less than the predetermined value, the constraint unit 131 determines that the band is not important. On the other hand, when the maximum value is greater than or equal to the predetermined value, the constraint unit 131 determines that the band is important.

Then, the constraint unit 131 maintains the level of normalized spectrum NS of the unimportant band at the rate of one or more normalized spectra NS for each of the number of dimensions of the encoding, and sets a residue to 0. That is, the normalized spectrum NS of the unimportant band is activated at the rate of one or more normalized spectra NS for each of the number of dimensions of the encoding, the residue is inactivated. Furthermore, the normalized spectrum to be activated, for example, is one or more normalized spectra among the normalized spectra for each of the number of dimensions of the encoding in a descending order of levels. The constraint unit 131 supplies a normalized spectrum NS3 after constraining the appearance probability thereof to the quantization unit 13.

On the other hand, when the bit rate of the code string B" is greater than or equal to the predetermined value, the constraint unit 131 directly supplies the normalized spectrum NS for each of the predetermined bands obtained by the normalization unit 12 to the quantization unit 13. In addition, the constraint unit 131 supplies constraint information CI which shows whether or not the appearance probability is constrained to the encoding unit 132 and the output unit 133.

The encoding unit 132 performs the encoding with respect to the quantization value Q of the normalized spectrum NS or a quantization value Q3 of the normalized spectrum NS3 which is supplied from the quantization unit 13. Specifically, when the constraint information CI supplied from the constraint unit 131 shows that the appearance probability is not constrained, the encoding unit 71 supplies the quantization value Q to the code book storage unit 16, thereby acquiring the variable length code H corresponding to the quantization value Q from the code book storage unit 73. In addition, when the constraint information CI shows that the appearance probability is constrained, the encoding unit 132 supplies the quantization value Q3 to the code book storage unit 134, thereby acquiring the variable length code H3 corresponding to the quantization value Q3 from the code book storage unit 134.

The encoding unit 132 supplies the number of bits N to the quantization unit 13 on the basis of the number of bits of the variable length code H or the like, or supplies the number of bits N3 to the quantization unit 13 on the basis of the number of bits of the variable length code H3 or the like, similar to the encoding unit 14 of FIG. 1. The encoding unit 132 supplies the variable length code H to the output unit 133 when the number of bits N is less than or equal to the value NQ, and supplies the variable length code H3 to the output unit 133 when the number of bits N3 is less than or equal to the value NQ.

The output unit 133 multiplexes the normalization coefficient F from the normalization unit 12, the quantization information W of the normalized spectrum NS or the quantization information W3 of the normalized spectrum NS3 from the quantization unit 13, the constraint information CI from the constraint unit 131, and the variable length code H or the variable length code H3 from the encoding unit 132, and outputs the code string B" obtained therefor.

The code book storage unit 134 stores a code book CB3 (a constraint code book) in which the value acquired as the quantization value Q3 and the variable length code are associated with each other and which is learned by constraining the appearance probability of the predetermined quantization value of the predetermined time signal for learning to 0 by the learning device (described later). When the quantization value Q3 is supplied from the encoding unit 132, the code book storage unit 134 reads out the variable length code H3 associated with the quantization value Q3 in the code book CB3, and supplies the variable length code H3 to the encoding unit 132.

Description of Code Book CB3

Figures 13, 14:
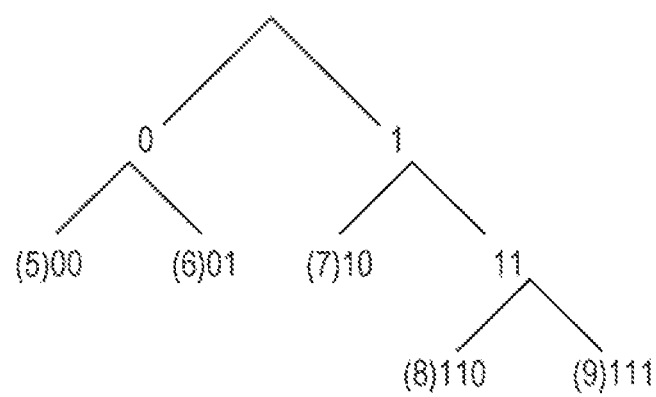
FIG. 13 is a diagram illustrating an example of a value acquired as a quantization value Q3.
FIG. 14 is a diagram illustrating an example of a variable length code which is allocated in a code book CB3.

FIG. 13 is a diagram illustrating an example of a value acquired as the quantization value Q3.

In the example of FIG. 13, similar to the case of FIG. 4, the encoding is in 2 dimensions, and the respective quantization values Q3 of two spectra which are the encoding targets are set as A and B, respectively. In addition, in the example of FIG. 13, similar to the case of FIG. 4, the acquired values of the quantization values A and B are 3 values of −1, 0, and +1, respectively.

In this case, when the constraint unit 131 maintains the level of any one of the normalized spectra corresponding to the quantization values A and B, and the level of the other is 0, any one of the quantization values A and B certainly becomes 0. Accordingly, the acquired combination of the quantization values (A, B) is (1, 0), (−1, 0), (0, 1), (0, −1), and (0, 0), and the appearance probabilities of (1, 1), (1, −1), (−1, 1), and (−1, −1) are constrained to 0. That is, the entries of the quantization values A and B are 5 entries of the entries (5) to (9).

Furthermore, when the combination of the quantization values (A, B) is (0, 0), it is possible for the encoder 130 not to perform the encoding. In this case, the entries of the quantization values A and B are 4 entries of the entries (5) to (8).

FIG. 14 is a diagram illustrating an example of the variable length code allocated to each of the entries (5) to (9) of FIG. 13 in the code book CB3.

Furthermore, in the example of FIG. 14, the appearance probabilities of the entries (5) to (8) are substantially identical to each other, and the appearance probability of the entry (9) is lower than the other appearance probabilities.

In this case, as illustrated in FIG. 14, for example, the codes "00", "01", and "10" of 2 bits are allocated to the quantization values of the entries (5) to (7), respectively, and the code "110" of 3 bits is allocated to the quantization value of the entry (8). In addition, the code "111" of 3 bits is allocated to the quantization value of the entry (9).

As described above, in the code book CB3 of FIG. 14, the code of 3 bits is allocated to two quantization values including the quantization value in which the appearance probability is the lowest, and the code of 2 bits is allocated to the quantization value in which the appearance probability is the highest. In this regard, when the two-dimensional fixed length encoding is performed with respect to the quantization value Q3, the number of bits of the fixed length code is always 3 bits in which 5 patterns are able to be shown. Accordingly, when the variable length encoding is performed on the basis of the code book CB3 of FIG. 14, it is possible to improve the encoding efficiency compared to a case where the fixed length encoding is performed.

In addition, since the number of entries in the code book of FIG. 14 is small compared to the code book of FIG. 10, the code length of the variable length code to be allocated to each of the quantization values is short compared to the code book of FIG. 10. Specifically, in the code book of FIG. 14, the code length allocated to two quantization values including the quantization value in which the appearance probability is the lowest is 3 bits, but in the code book of FIG. 10, the code length is 4 bits. In addition, in the code book of FIG. 14, the code length allocated to the quantization value in which the appearance probability is the highest is 2 bits, but in the code book of FIG. 10, the code length is 3 bits. Accordingly, when the appearance probability is constrained by the constraint unit 131, it is possible to improve the encoding efficiency.

Description of Process of Encoder

Figure 15:
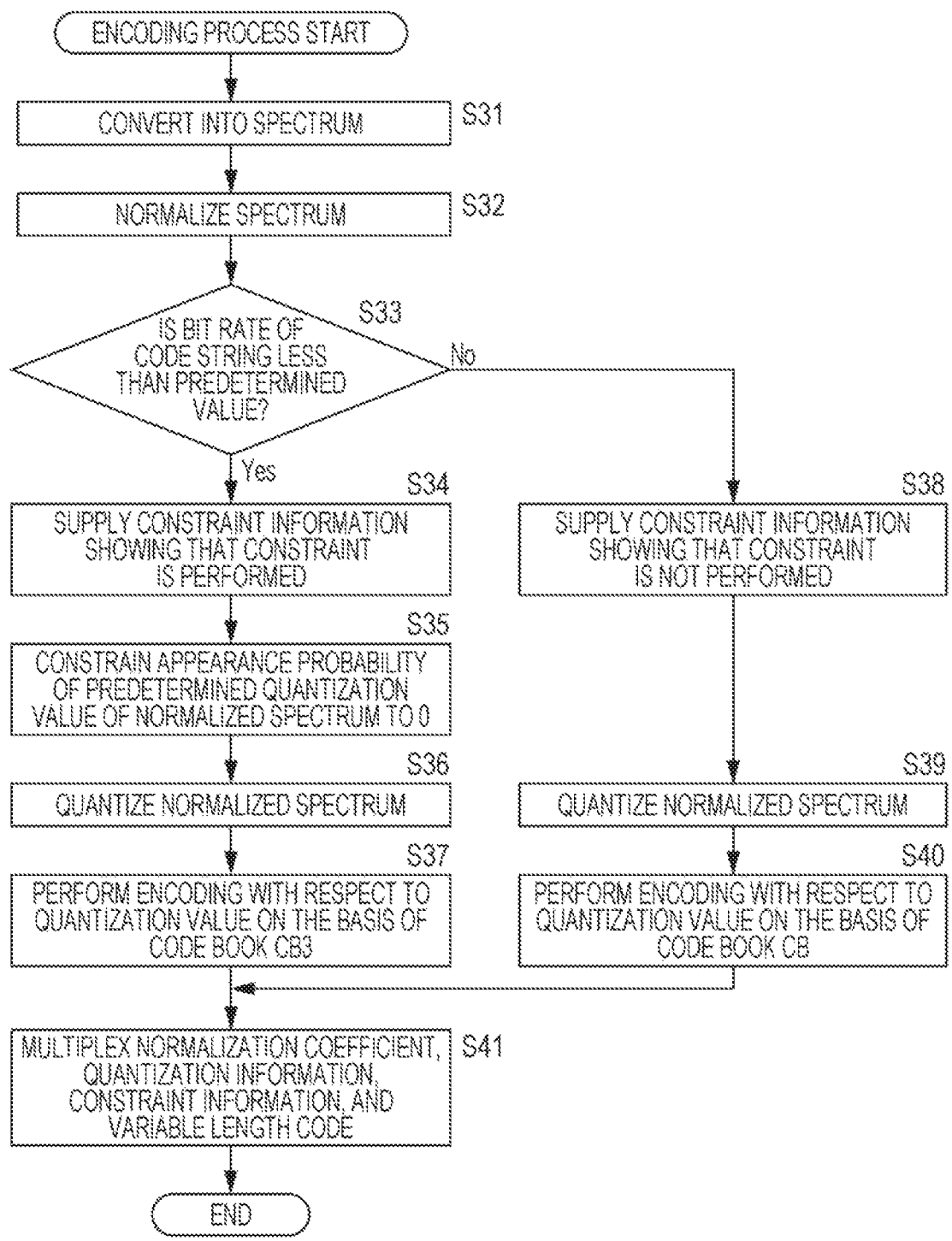
FIG. 15 is a flowchart for describing an encoding process of the encoder of FIG. 12.

FIG. 15 is a flowchart for describing an encoding process of the encoder 130 of FIG. 12.

In Step S31 of FIG. 15, the spectrum conversion unit 11 of the encoder 130 performs the time-frequency conversion with respect to the time signal T input from the outside, and converts the time signal T to the spectrum S. The spectrum conversion unit 11 supplies the spectrum S to the normalization unit 12.

In Step S32, the normalization unit 12 determines the normalization coefficient F of the spectrum S for each of the predetermined bands, from the spectrum S supplied from the spectrum conversion unit 11, and normalizes the spectrum S by using the normalization coefficient F. Then, the normalization unit 12 supplies the normalized spectrum NS obtained therefor to the constraint unit 131, and supplies the normalization coefficient E to the output unit 133.

In Step S33, the constraint unit 131 determines whether or not the bit rate of the preset code string B" is lower than the predetermined value. In Step S33, when the bit rate of the code string B" is lower than the predetermined value, in Step S34, the constraint unit 131 supplies the constraint information CI showing that the appearance probability is constrained to the output unit 133.

In Step S35, the constraint unit 131 constrains the appearance probability of the predetermined quantization value of the normalized spectrum NS of the unimportant band among the normalized spectra NS for each of the predetermined bands supplied from the normalization unit 12 to 0. Then, the constraint unit 131 supplies the normalized spectrum NS3 after constraining the appearance probability thereof to the quantization unit 13.

In Step S36, the quantization unit 13 quantizes the normalized spectrum NS3 supplied from the constraint unit 131 on the basis of the quantization information W3, and supplies the quantization value Q3 obtained therefor to the encoding unit 132. At this time, the quantization unit 13 acquires the number of bits N3 fed back from the encoding unit 132 in response to the quantization value Q3, and adjusts the quantization information W3 such that the number of bits N3 is the predetermined value. The quantization unit 13 supplies the quantization information W3 after being adjusted to the output unit 133.

In Step S37, the encoding unit 132 performs the encoding with respect to the quantization value Q3 supplied from the quantization unit 13, on the basis of the code book CB3 stored in the code book storage unit 134. Then, the encoding unit 132 supplies the number of bits N3 to the quantization unit 13 on the basis of the number of bits of the variable length code H3 obtained therefor or the like, and supplies the variable length code H3 to the output unit 133 when the number of bits N3 is less than or equal to the value NQ.

On the other hand, in Step S33, when the bit rate of the code string B" is not lower than the predetermined value, that is, the bit rate of the code string B" is greater than or equal to the predetermined value, the process proceeds to Step S38. In Step S38, the constraint unit 131 supplies the constraint information CI showing that the appearance probability is not constrained to the output unit 133. In addition, the constraint unit 131 directly supplies the normalized spectrum NS for each of the predetermined bands supplied from the normalization unit 12 to the quantization unit 13.

In Step S39, the quantization unit 13 quantizes the normalized spectrum NS supplied from the constraint unit 131, on the basis of the quantization information W, and supplies the quantization value Q obtained therefor to the encoding unit 132. At this time, the quantization unit 13 acquires the number of bits N fed back from the encoding unit 132 in response to the quantization value Q, and adjusts the quantization information W such that the number of bits N is the predetermined value. The quantization unit 13 supplies the quantization information W after being adjusted to the output unit 133.

In Step S40, the encoding unit 132 performs the encoding with respect to the quantization value Q supplied from the quantization unit 13, on the basis of the code book CB stored in the code book storage unit 16. Then, the encoding unit 132 supplies the number of bits N to the quantization unit 13 on the basis of the number of bits of the variable length code H obtained therefor or the like, and supplies the variable length code H to the output unit 133 when the number of bits N is less than or equal to the value NQ.

In Step S41, the output unit 133 multiplexes the normalization coefficient F from the normalization unit 12, the quantization information W or the quantization information W3 from the quantization unit 13, the constraint Information CI from the constraint unit 131, and the variable length code H or the variable length code H3 from the encoding unit 14. The output unit 133 outputs the code string B" obtained therefor.

Description of Effect of the Present Invention

Figure 16:
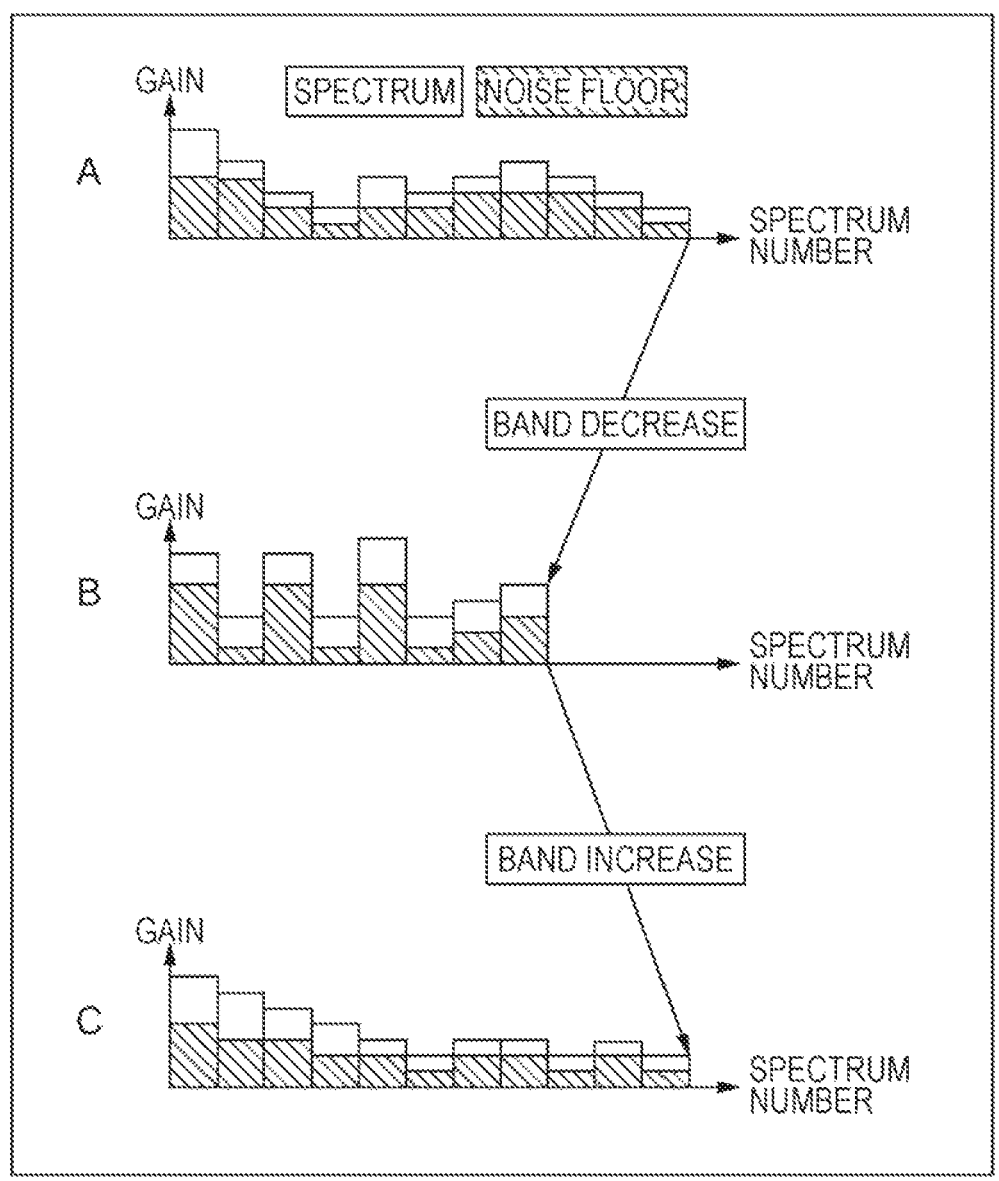
FIG. 16 is a diagram illustrating a normalized spectrum corresponding to a quantization value encoded by the encoder of FIG. 1 or FIG. 7.
Figure 17:
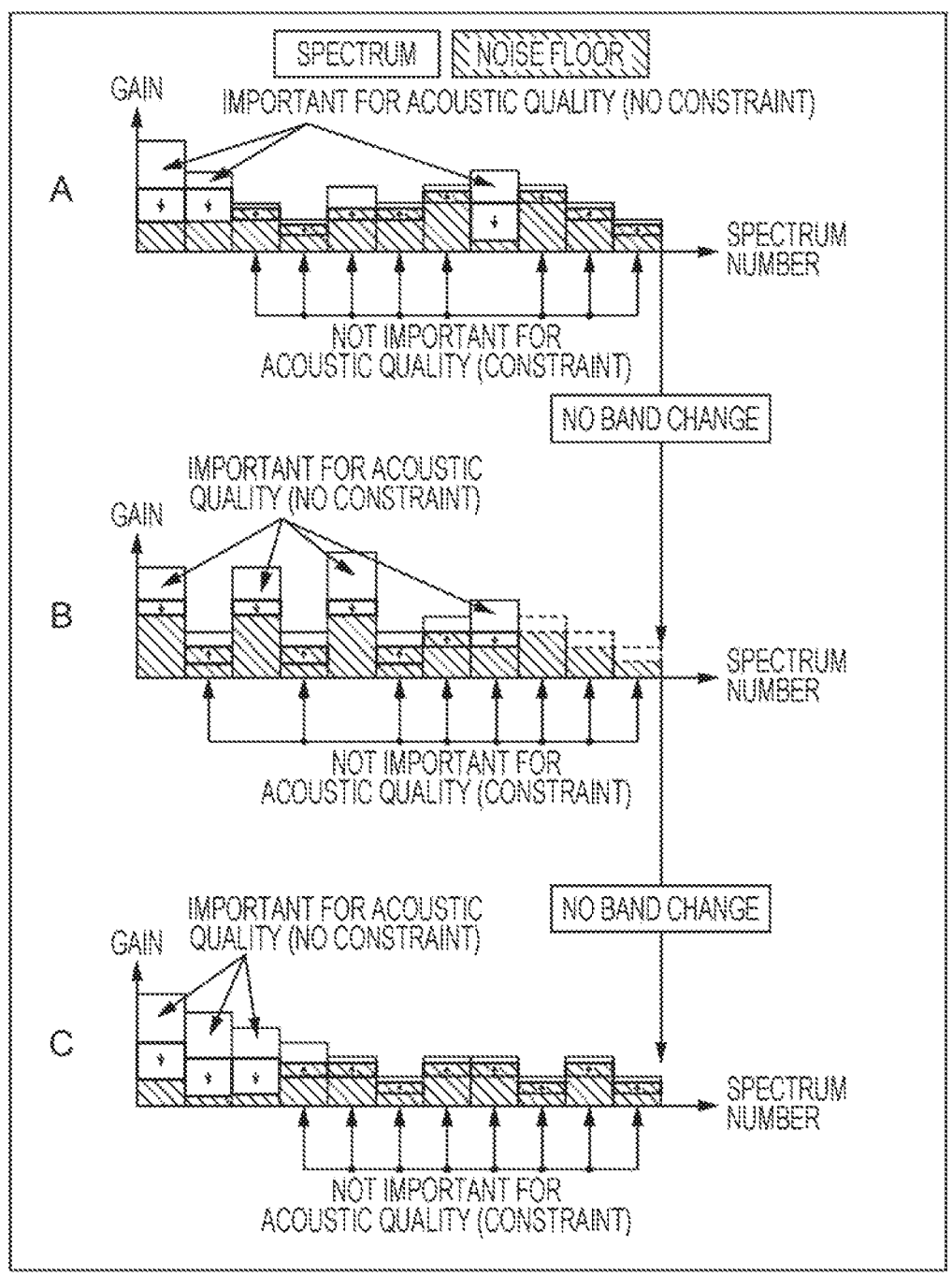
FIG. 17 is a diagram illustrating a normalized spectrum corresponding to a quantization value encoded by the encoder of FIG. 12.

FIG. 16 is a diagram illustrating the normalized spectrum corresponding to the quantization value encoded by the encoder 10 of FIG. 1 or the encoder 70 of FIG. 7, and FIG. 17 is a diagram illustrating the normalized spectrum corresponding to the quantization value encoded by the encoder 130 of FIG. 12.

Furthermore, in FIG. 16 and FIG. 17, the bit rate of the code string is 16 kbps, 64 kbps, 32 kbps or the like which Is less than the predetermined value (for example, 128 kbps). In addition, in the graphs of FIG. 16 and FIG. 17, a horizontal axis indicates the spectrum numbers of the normalized spectra, and a vertical axis indicates gains which are the highest levels for each of the predetermined bands of the normalized spectrum and a noise floor.

As illustrated in A of FIG. 16 or C of FIG. 16, in the encoder 10 of FIG. 1 or the encoder 70 of FIG. 7, when the gain of the entire band is relatively small, the variable length encoding is performed with respect to the quantization value of the normalized spectrum of the predetermined band.

However, as illustrated in B of FIG. 16, when the gain of the predetermined band is relatively big, the band corresponding to the quantization value to be subjected to the variable length encoding is reduced due to the insufficient bit rate of the code string, and the level of the noise floor increases according to a degradation of the quantization accuracy.

In addition, when the state of A of FIG. 16 or C of FIG. 16, and the state of B of FIG. 16 alternately occur, the band corresponding to the quantization value to be subjected to the variable length encoding is changed, and an audience experiences an extremely uncomfortable level of noise.

In this regard, in the encoder 130 of FIG. 17, as illustrated in A of FIG. 17 to C of FIG. 17, it is determined whether or not each of the bands corresponding to the normalized spectrum is important, and the appearance probability of the quantization value is constrained only with respect to the normalized spectrum of the unimportant band.

Accordingly, as illustrated by an arrow in an upward direction of FIG. 17, the quantization accuracy of the normalized spectrum of the unimportant band is degraded, and the level of the noise floor increases, but the encoding efficiency of the quantization value of the normalized spectrum is improved.

Accordingly, as illustrated by an arrow in a downward direction of FIG. 17, it is possible to improve the quantization accuracy of the normalized spectrum of the important band by a redundant bit generated according to the improvement of the encoding efficiency, thereby allowing the level of the noise floor of the normalized spectrum to be decreased. As a result, it is possible to improve the acoustic quality of the important band.

In addition, as illustrated in B of FIG. 17, when the gain of the predetermined band is relatively big, it is possible to perform the variable length encoding with respect to the quantization value of the normalized spectrum of a normal band by the redundant bit generated according to the improvement of the encoding efficiency. As a result, the band corresponding to the quantization value to be subjected to the variable length encoding is not changed, thereby preventing the audience from experiencing the extremely uncomfortable level of noise.

As described above, the encoder 130 constrains the appearance probability of the predetermined quantization value of the normalized spectrum NS to 0, and performs the encoding with respect to the quantization value Q3 of the normalized spectrum NS3 after being constrained on the basis of the code book CB3, thereby allowing the encoding efficiency to be improved.

Furthermore, the encoder 130 may first perform the encoding without constraining, on the basis of the code book CB (a no-constraint code book), and perform the encoding again with constraining when the number of bits N at this time becomes larger as a requirement for reducing the band corresponding to the quantization value which is the encoding target increases, thereby setting the result as the final encoding result, instead of determining whether or not the appearance probability is constrained on the basis of the bit rate of the code string B".

Configuration Example According to First Embodiment of Decoder

Figure 18:
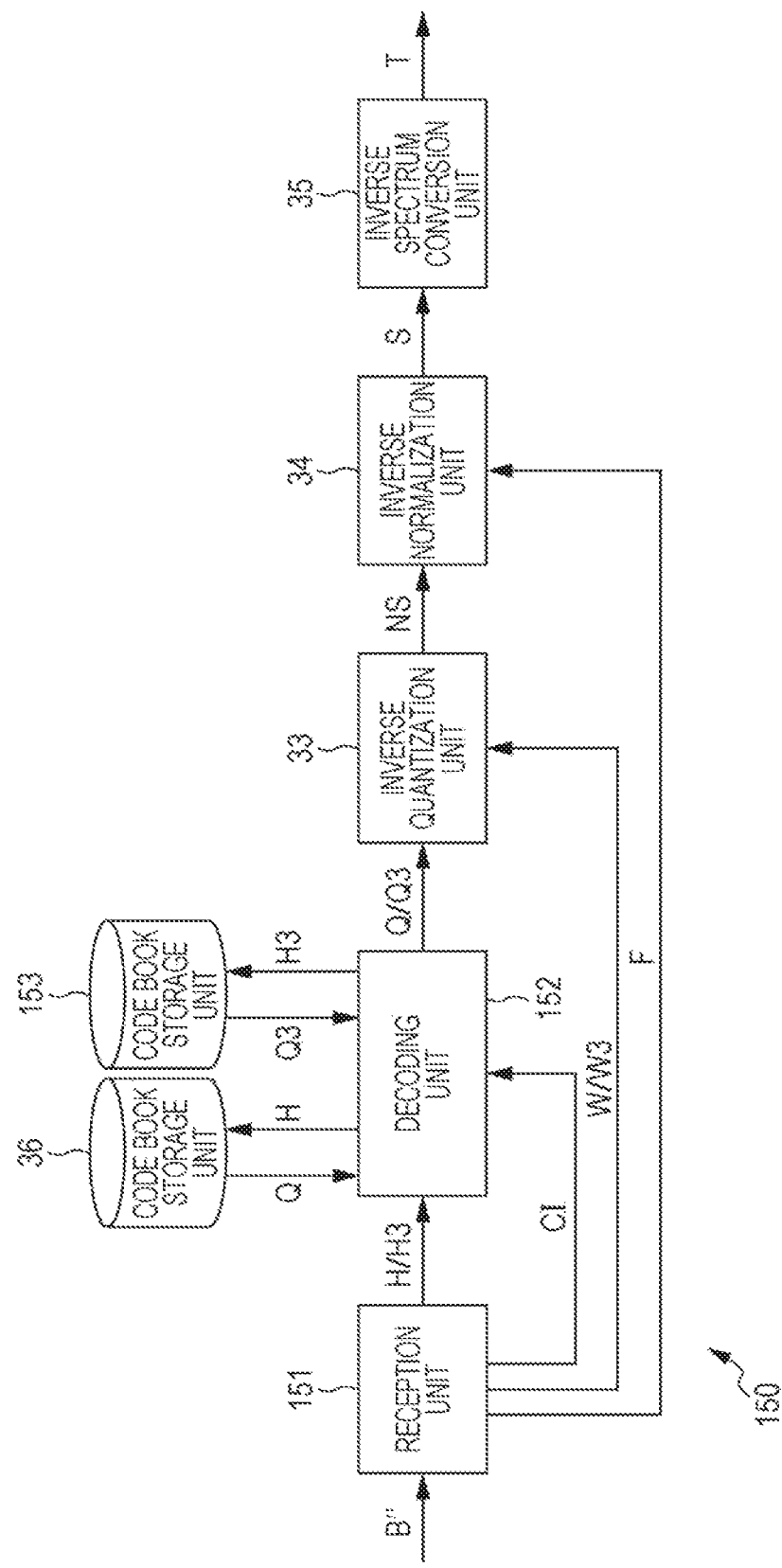
FIG. 18 is a block diagram illustrating a configuration example according to an embodiment of the decoder to which the present technology is applied.

FIG. 18 is a block diagram illustrating a configuration example of the decoder for decoding the code string B" output from the encoder 130 of FIG. 12.

Among configurations illustrated in FIG. 18, the same reference numerals are applied to the same configurations as those of FIG. 2. The repeated description thereof will be properly omitted.

A configuration of a decoder 150 of FIG. 18 is different from the configuration of FIG. 2 in that a reception unit 151 and a decoding unit 152 are provided instead of the reception unit 31 and the decoding unit 32, and a code book storage unit 153 is newly provided.

The reception unit 151 of the decoder 150 receives the code string B" output from the encoder 130 of FIG. 12. The reception unit 151 disassembles the code string B" into the variable length code H or the variable length code H3, the constraint information CI, the quantization information W or the quantization information W3, and the normalization coefficient F. The reception unit 151 supplies the variable length code H or the variable length code H3 and the constraint information CI to the decoding unit 152, supplies the quantization information W or the quantization information W3 to the inverse quantization unit 33, and supplies the normalization coefficient F to the inverse normalization unit 34.

The decoding unit 152 performs the decoding with respect to the variable length code H or the variable length code H3, on the basis of the constraint information CI supplied from the reception unit 151. Specifically, when the constraint information CI is information showing that the constraint is not performed, the decoding unit 152 supplies the variable length code H to the code book storage unit 36, thereby acquiring the quantization value Q corresponding to the variable length code H as the decoding result. On the other hand, when the constraint information CI is information showing that the constraint is performed, the decoding unit 152 supplies the variable length code H3 to the code book storage unit 153, thereby acquiring the quantization value Q3 corresponding to the variable length code H3 as the decoding result. The decoding unit 152 supplies the quantization value Q or the quantization value Q3 which is the decoding result to the inverse quantization unit 33.

The code book storage unit 153 stores a code book CB3 identical to the code book CB3 stored in the code book storage unit 134 of FIG. 12. When the variable length code H3 is supplied from the decoding unit 152, the code book storage unit 153 reads out the quantization value Q3 associated with the variable length code H3 in the code book CB3, and supplies the quantization value Q3 to the decoding unit 152.

Furthermore, the normalized spectrum NS which is an inverse quantization result of the quantization value Q or the quantization value Q3, the frequency spectrum S which is an inverse normalization result of the normalized spectrum NS, and the time signal T which is a frequency-time conversion result of the frequency spectrum S of the decoder 150, include an error according to the quantization, and thus do not completely coincide with the normalized spectrum NS, the frequency spectrum S, and the time signal T of the encoder 130.

Description of Process of Decoder

Figure 19:
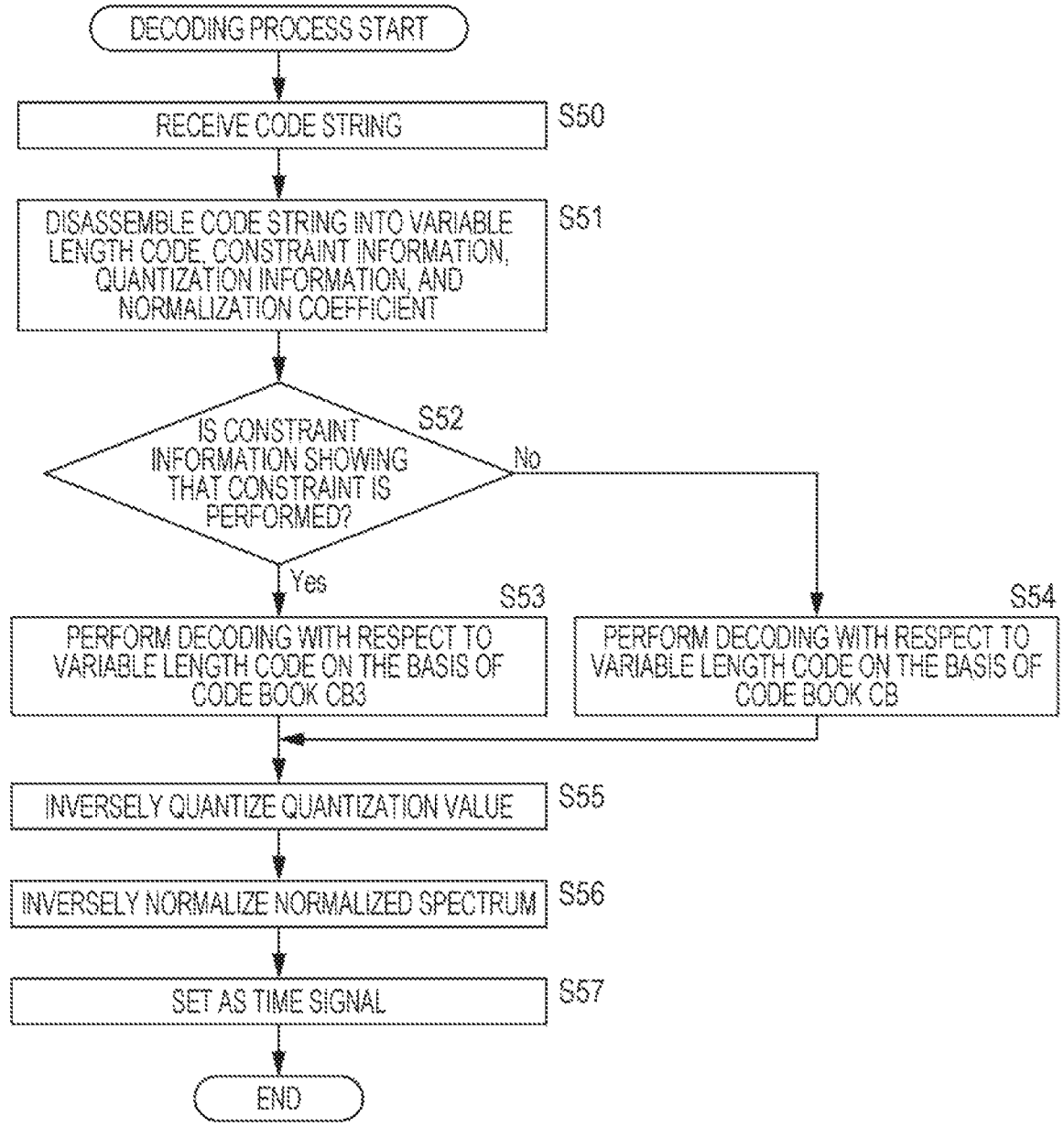
FIG. 19 is a flowchart for describing a decoding process of the decoder of FIG. 18.

FIG. 19 is a flowchart for describing a decoding process of the decoder 150 of FIG. 18.

In Step S50 of FIG. 19, the reception unit 151 of the decoder 150 receives the code string B" output from the encoder 130 of FIG. 12.

In Step S51, the reception unit 151 disassembles the code string B" into the variable length code H or the variable length code H3, the constraint information CI, the quantization information W or the quantization information W3, and the normalization coefficient F. The reception unit 151 supplies the variable length code H or the variable length code H3 and the constraint information CI to the decoding unit 152, supplies the quantization information W or the quantization information W3 to the inverse quantization unit 33, and supplies the normalization coefficient F to the inverse normalization unit 34.

In Step S52, the decoding unit 152 determines whether or not the constraint information CI supplied from the reception unit 151 shows that the constraint is performed.

In Step S52, when the constraint information CI shows that the constraint is performed, in Step S53, the decoding unit 152 performs the decoding with respect to the variable length code H3, on the basis of the code book CB3 stored in the code book storage unit 153. The decoding unit 152 supplies the quantization value Q3 which is the decoding result to the inverse quantization unit 33, and the process proceeds to Step 355.

On the other hand, in Step S52, when the constraint information CI does not show that the constraint is performed, in Step S54, the decoding unit 152 performs the decoding with respect to the variable length code H, on the basis of the code book CB stored in the code book storage unit 36. The decoding unit 152 supplies the quantization value Q which is the decoding result to the inverse quantization unit 33, and the process proceeds to Step S55.

In Step S55, the inverse quantization unit 33 inversely quantizes the quantization value Q supplied from the decoding unit 152, on the basis of the quantization information W supplied from the reception unit 151, or inversely quantizes the quantization value Q3 supplied from the decoding unit 152, on the basis of the quantization information W3 supplied from the reception unit 151. The inverse quantization unit 33 supplies the normalized spectrum NS which is obtained as the inverse quantization result to the inverse normalization unit 34.

In Step S56, the inverse normalization unit 34 inversely normalizes the normalized spectrum NS supplied from the inverse quantization unit 33 for each of the predetermined bands, by using the normalization coefficient F supplied from the reception unit 151, and supplies the frequency spectrum S obtained therefor to the inverse spectrum conversion unit 35.

In Step S57, the inverse spectrum conversion unit 35 performs the frequency-time conversion with respect to the frequency spectrum S supplied from the inverse normalization unit 34, and outputs the resultant as the time signal T.

As described above, since the decoder 150 performs the decoding with respect to the variable length code H3 on the basis of the code book CB3, it is possible to perform the decoding with respect to the variable length code H3 in which the encoding efficiency is improved by constraining the appearance probability of the predetermined quantization value of the normalized spectrum NS to 0.

Configuration Example of Learning Device

Figure 20:
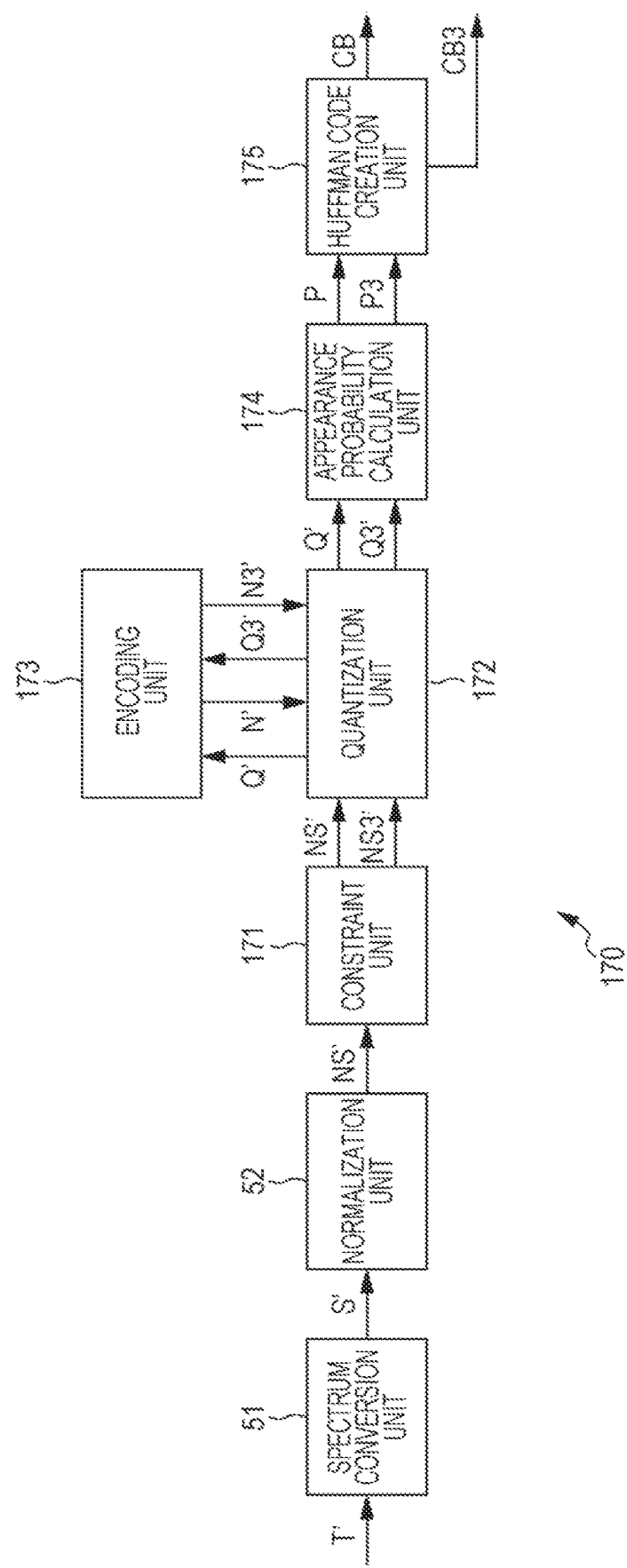
FIG. 20 is a block diagram illustrating a configuration example of the learning device for learning the code book CB and the code book CB3.

FIG. 20 is a block diagram illustrating a configuration example of the learning device for learning the code book CB and the code book CB3.

Among configurations illustrated in FIG. 20, the same reference numerals are applied to the same configurations as those of FIG. 3. The repeated description thereof will be properly omitted.

A configuration of a learning device 170 of FIG. 20 is different from the configuration of FIG. 3 in that a quantization unit 172, an encoding unit 173, an appearance probability calculation unit 174, and a Huffman code creation unit 175 are provided instead of the quantization unit 53, the encoding unit 54, the appearance probability calculation unit 55, and the Huffman code creation unit 56, and a constraint unit 171 is newly provided.

The constraint unit 171 of the learning device 170 directly supplies the normalized spectrum NS' for each of the predetermined bands obtained by the normalization unit 52 to the quantization unit 172. In addition, similar to the constraint unit 131 of FIG. 12, the constraint unit 171 constrains the appearance probability of the predetermined quantization value of the normalized spectrum NS' of the unimportant band among the normalized spectra NS' for each of the predetermined bands obtained by the normalization unit 52 to 0. Then, the constraint unit 171 supplies the normalized spectrum NS3' after being constrained to the quantization unit 172.

Similar to the quantization unit 53 of FIG. 3, the quantization unit 172 quantizes the normalized spectrum NS' supplied from the constraint unit 171, on the basis of the quantization information W', and supplies the quantization value Q' obtained therefor to the encoding unit 173. At this time, similar to the quantization unit 53, the quantization unit 172 acquires the number of bits N' fed back from the encoding unit 173 in response to the quantization value Q', and adjusts the quantization information W' such that the number of bits N' is the predetermined value. The quantization unit 172 supplies the final quantization value Q' to the appearance probability calculation unit 174.

In addition, as the same applies to the normalized spectrum NS3', the quantization unit 172 quantizes the normalized spectrum NS3' on the basis of the quantization information W3', and supplies the quantization value Q3' obtained therefor to the encoding unit 173. At this time, the quantization unit 172 acquires the number of bits N3' fed back from the encoding unit 173 in response to the quantization value Q3', and adjusts the quantization information W3' such that the number of bits N3' is the predetermined value. The quantization unit 172 supplies the final quantization value Q3' to the appearance probability calculation unit 174.

The encoding unit 173 performs the fixed length encoding with respect to the quantization value Q' and the quantization value Q3' which are supplied from the quantization unit 172. The encoding unit 173 calculates a value as the number of bits N' by adding the number of bits NH' of the fixed length code of the quantization value Q', the number of bits NW' of the quantization information W', and the number of bits NF' of the normalization coefficient F', and supplies the value to the quantization unit 172. Similarly, the encoding unit 173 calculates a value as the number of bits N3' by adding the number of bits NH3' of the fixed length code of the quantization value Q3', the number of bits NW3' of the quantization information W3', and the number of bits NF', and supplies the value to the quantization unit 172.

Accordingly, the quantization unit 172 adjusts the quantization information W' such that the number of bits N' is less than or equal to the value corresponding to the bit rate of the set code string, and adjusts the quantization information W3' such that the number of bits N3' is less than or equal to the value corresponding to the bit rate of the set code string.

The appearance probability calculation unit 174 sets the value acquired as the quantization value Q' (the quantization value Q) as the entry on the basis of the quantization value Q' supplied from the quantization unit 172, and counts the number of appearances for each of the entries. The appearance probability calculation unit 174 supplies the number of appearances for each of the entries of the entire time signal T' to the Huffman code creation unit 175 as the appearance probability P of each of the entries.

In addition, the appearance probability calculation unit 174 sets the value acquired as the quantization value Q3' (the quantization value Q3) as the entry on the basis of the quantization value Q3' supplied from the quantization unit 172, and counts the number of appearances for each of the entries. The appearance probability calculation unit 174 supplies the number of appearances for each of the entries of the entire time signal T' to the Huffman code creation unit 175 as the appearance probability P3 of each of the entries. Furthermore, as described in FIG. 13, the number of entries corresponding to the appearance probability P3 is less than the number of entries corresponding to the appearance probability P.

The Huffman code creation unit 175 allocates the variable length code which is longer in code length as the appearance probability P decreases with respect to the quantization value which is each of the entries, on the basis of the appearance probability P of each of the entries supplied from the appearance probability calculation unit 174. The Huffman code creation unit 175 prepares the code book CB in which the respective quantization values and the variable length code allocated to the quantization value are associated with each other. The code book CB is stored in the code book storage unit 16 of FIG. 12 and the code book storage unit 36 of FIG. 18.

In addition, the Huffman code creation unit 175 allocates the variable length code which is longer in code length as the appearance probability P3 decreases with respect to the quantization value which is each of the entries, on the basis of the appearance probability P3 of each of the entries supplied from the appearance probability calculation unit 174. The Huffman code creation unit 175 prepares the code book CB3 in which the respective quantization values and the variable length code allocated to the quantization value are associated with each other. The code book CB3 is a code book in which the number of entries is small compared to the code book CB, and is stored in the code book storage unit 134 of FIG. 12 and the code book storage unit 153 of FIG. 18.

Description of Process of Learning Device

Since the preparation process of the code book CB of the learning device 170 of FIG. 20 is similar to the preparation process of FIG. 6 except that the normalized spectrum NS' obtained by the normalization unit 52 is supplied to the quantization unit 172 through the constraint unit 171, only the preparation process of the code book CB3 will be described.

Figure 21:
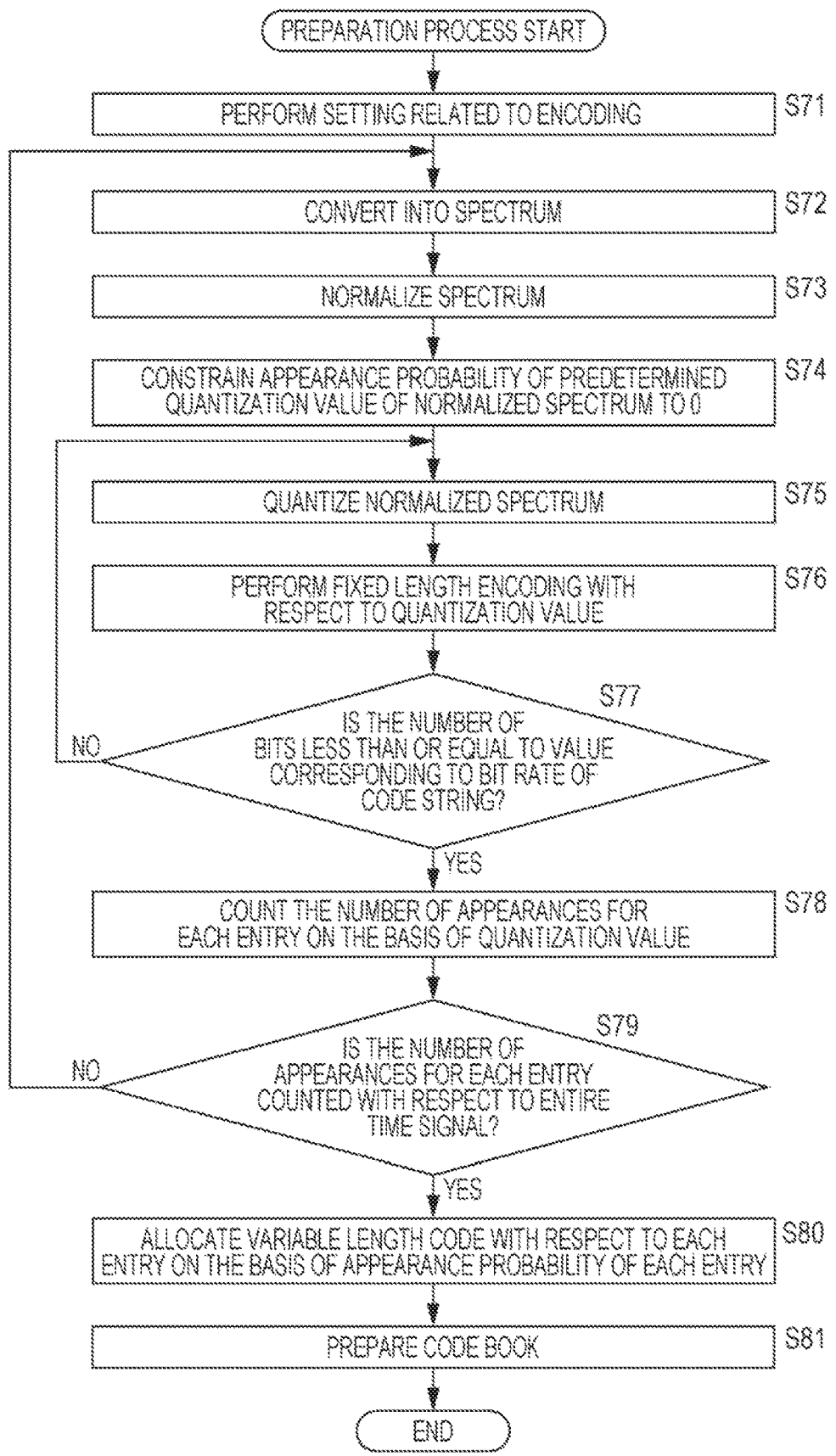
FIG. 21 is a flowchart for describing a preparation process of the learning device of FIG. 20.

FIG. 21 is a flowchart for describing a preparation process of the code book CB3 of the learning device 170.

Since the processes of Steps S71 to S73 of FIG. 21 are similar to the processes of Steps S11 to S13 of FIG. 6, the description thereof will be omitted.

In Step S74, the constraint unit 171 constrains the appearance probability of the predetermined quantization value of the normalized spectrum NS' of the unimportant band among the normalized spectra NS' for each of the predetermined bands supplied from the normalization unit 52 to 0. Then, the constraint unit 171 supplies the normalized spectrum NS3' after being constrained to the quantization unit 172.

In Step S75, the quantization unit 172 quantizes the normalized spectrum NS3' supplied from the constraint unit 171 on the basis of the quantization information W3', and supplies the quantization value Q3' obtained therefor to the encoding unit 173.

In Step S76, the encoding unit 173 performs the fixed length encoding with respect to the quantization value Q3' supplied from the quantization unit 172. The encoding unit 173 calculates a value as the number of bits N3' by adding the number of bits NH3' of the fixed length code, the number of bits NW3' of the quantization information W3', and the number of bits NF3' of the normalization coefficient F3', and supplies the value to the quantization unit 172.

In Step S77, it is determined whether or not the number of bits N3' is less than or equal to the value corresponding to the bit rate of the set code string. In Step S77, when the number of bits N3' is not less than or equal to the value corresponding to the bit rate of the set code string, the quantization unit 172 changes the quantization information W3'. Then, the process returns to Step S75, and the processes of Steps S75 to S77 are repeated until the number of bits N3' is less than or equal to the value corresponding to the bit rate of the set code string.

On the other hand, in Step S77, when the number of bits N3' is less than or equal to the value corresponding to the bit rate of the set code string, the quantization unit 172 supplies the quantization value Q3' to the appearance probability calculation unit 174.

Then, in Step S78, the appearance probability calculation unit 174 sets the value acquired as the quantization value Q3' (the quantization value Q3) as the entry on the basis of the quantization value Q3' supplied from the quantization unit 172, and counts the number of appearances for each of the entries.

In Step S79, the learning device 170 determines whether or not the number of appearances for each of the entries is counted with respect to the entire time signal T'. In Step S79, when the number of appearances for each of the entries is not yet counted with respect to the entire time signal T', the process returns to Step S72, and the processes of Steps S72 to S79 are repeated.

On the other hand, in Step S79, when the number of appearances for each of the entries is counted with respect to the entire time signal T', the appearance probability calculation unit 174 supplies the number of appearances for each of the entries with respect to the entire time signal T' to the Huffman code creation unit 175 as the appearance probability P3 of each of the entries.

Then, in Step S80, the Huffman code creation unit 175 allocates the variable length code which is longer in code length as the appearance probability P3 decreases with respect to the quantization value which is each of the entries, on the basis of the appearance probability P3 of each of the entries supplied from the appearance probability calculation unit 174.

In Step S81, the Huffman code creation unit 175 prepares the code book CB3 in which the respective quantization values and the variable length code allocated to the quantization value are associated with each other. The code book CB3 is stored in the code book storage unit 134 (FIG. 12) and the code book storage unit 153 (FIG. 18).

Furthermore, the time signal for learning used in learning the code book CB3 and the time signal for learning used in learning the code book CB may be different from each other.

In addition, it is also possible to apply the present technology to an encoder or a decoder in which a signal other than the acoustic signal is a process target.

Description of Computer to which the Present Invention is Applied

A series of processes described above is able to be executed by hardware, and be executed by software. When the series of processes are executed by the software, a program which constitutes the software is installed in a computer. Here, examples of the computer include a computer in which dedicated hardware is incorporated, a computer which enables various functions to be executed by installing various programs, such as a general-purpose personal computer, and the like.

Figure 22:
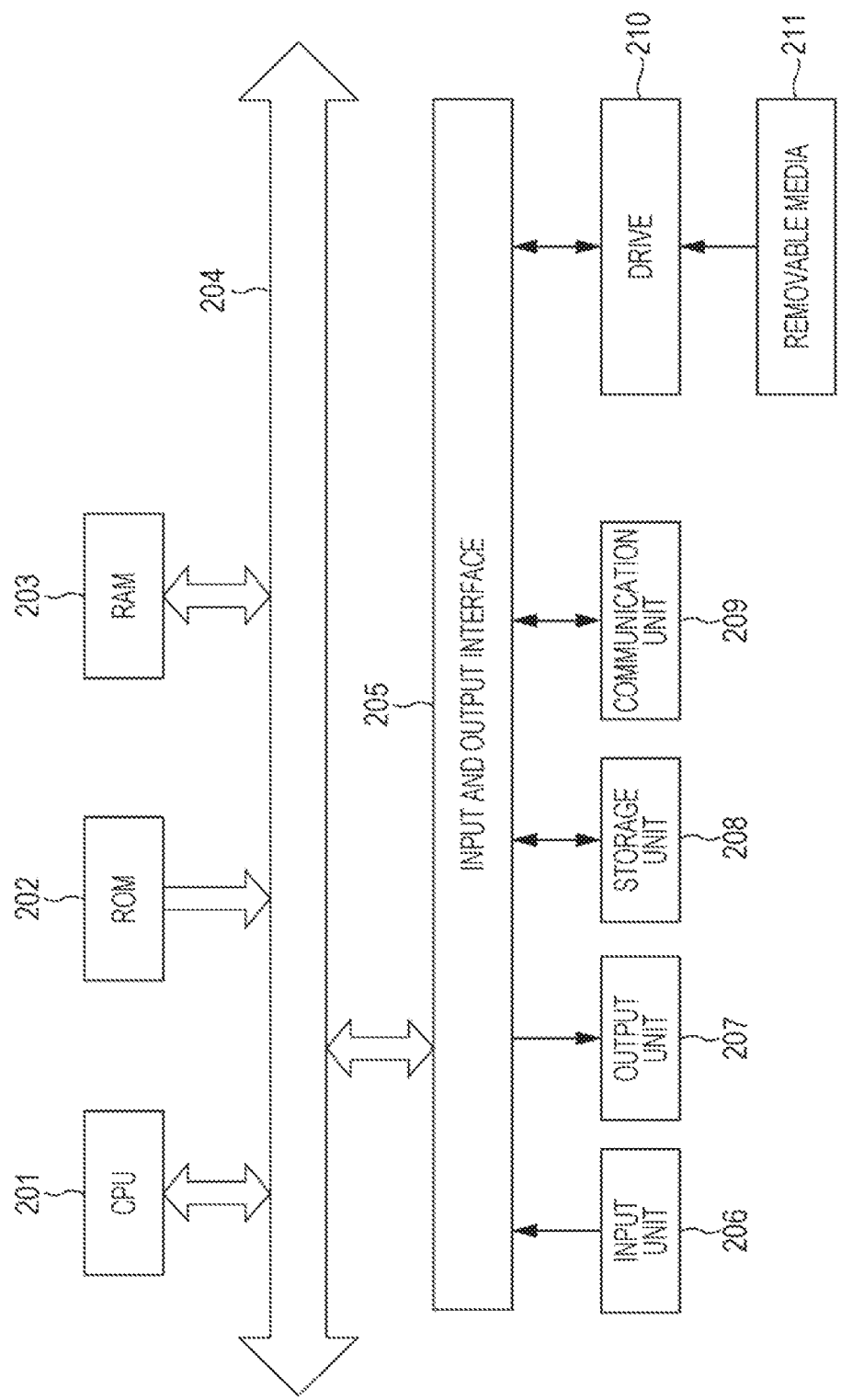
FIG. 22 is a block diagram illustrating a configuration example of computer hardware.

FIG. 22 is a block diagram illustrating a configuration example of hardware of a computer which executes a series of processes described above by a program.

In the computer, a Central Processing Unit (CPU) 201, a Read Only Memory (ROM) 202, and a Random Access Memory (RAM) 203 are connected with each other through a bus 204.

The bus 204 is further connected with an input and output interface 205. The input and output interface 205 is connected with an input unit 206, an output unit 207, a storage unit 208, a communication unit 209, and a drive 210.

The input unit 206 includes a keyboard, a mouse, a microphone, or the like. The output unit 207 includes a display, a speaker, or the like. The storage unit 208 includes a hard disk, a non-volatile memory, or the like. The communication unit 209 includes a network interface or the like. The drive 210 drives a removable media 211 such as a magnetic disk, an optical disk, a magnetic optical disk, or a semiconductor memory.

In the computer configured as described above, the CPU 201 loads and executes, for example, the program stored in the storage unit 208, in the RAM 203 through the input and output interface 205 and the bus 204, thereby performing the series of processes described above.

The program executed by the computer (CPU 201), for example, is able to be provided by recording in the removable media 211 as a package media or the like. In addition, the program is able to be provided via a wired or wireless transmission medium such as a local area network, the Internet, and a digital satellite broadcast.

In the computer, the program is able to be installed in the storage unit 208 by mounting the removable media 211 onto the drive 210 through the input and output interface 205. In addition, the program is able to be received by the communication unit 209 via the wired or wireless transmission medium, and to be installed in the storage unit 208. In addition, the program is able to be installed in the ROM 202 or the storage unit 208 in advance.

Furthermore, the program executed by the computer may be a program by which the process is performed in chronological order according to the procedure described herein, or may be a program by which the process is performed in parallel or at a necessary timing such as a timing of calling.

In addition, the embodiments of the present technology are not limited to the embodiments described above, and the embodiments of the present technology may be variously changed within the scope not departing from the gist of the present technology.

For example, the present technology may have a configuration of cloud computing in which one function is divided and jointly processed by a plurality of devices via a network.

In addition, the respective steps described in the flowchart above, are able to be performed not only by one device, but also by a plurality of devices by which the step is divided.

Further, when a plurality of processes is included in one step, the plurality of processes included in one step is able to be performed not only by one device, but also by a plurality of devices by which the processes are divided.

In addition, the present technology is able to be configured as the following.

(1)

An encoder including:

a constraint unit which constrains an appearance probability of a predetermined quantization value of a signal to 0; and an encoding unit which performs encoding with respect to the quantization value of the signal constrained by the constraint unit, on the basis of a constraint code book which is a code book having a variable length code which is longer in code length as the appearance probability decreases allocated with respect to each of a plurality of quantization values other than the predetermined quantization value of a signal for learning corresponding to the signal, the appearance probability of the predetermined quantization value of the signal for learning being constrained to 0.

(2)

The encoder according to (1), further including:

an output unit which outputs a code obtained as an encoding result by the encoding unit, wherein when a bit rate of the signal is less than a predetermined value, the constraint unit constrains the appearance probability of the predetermined quantization value of the signal to 0, and the output unit outputs the code, and constraint information which shows whether or not constraint is performed by the constraint unit.

(3)

The encoder according to (1), further including:

an output unit which outputs a code obtained as an encoding result by the encoding unit, wherein the encoding unit performs the encoding with respect to the quantization value of the signal which is not constrained by the constraint unit, on the basis of a no-constraint code book which is a code book having the variable length code which is longer in code length as the appearance probability decreases allocated with respect to each of the plurality of quantization values of the signal for learning in which the appearance probability of the predetermined quantization value is not constrained, when the code of the quantization value of the signal which is not constrained by the constraint unit and is subjected to the encoding by the encoding unit is a large amount, the constraint unit constrains the appearance probability of the predetermined quantization value of the signal to 0, the encoding unit performs the encoding with respect to the quantization value of the signal which is constrained by the constraint unit on the basis of the constraint code book, and sets the code obtained therefor as a final code, and the output unit outputs the final code, and constraint information which shows whether or not constraint is performed by the constraint unit.

(4)

The encoder according to (1), further including:

an output unit which outputs a code obtained as an encoding result by the encoding unit, wherein when a level of spectrum group of the signal is less than a predetermined value, the constraint unit constrains the appearance probability of the predetermined quantization value of the spectrum group of the signal to 0, and the output unit outputs the code and constraint information which shows whether or not constraint is performed by the constraint unit.

(5)

The encoder according to any one of (1) to (4), wherein the constraint unit constrains the appearance probability of the predetermined quantization value of the spectrum group of the signal to 0 by activating a predetermined spectrum among the spectrum group of the signal and inactivating a residual spectrum.

(6)

The encoder according to (5), wherein the constraint unit inactivates the residual spectrum by setting a level of residual spectrum to 0.

(7)

The encoder according to (5), wherein the predetermined spectrum is one or more spectra in a descending order of levels among the spectra of the spectrum group.

(8)

An encoding method including:

a constraining step in which an encoder constrains an appearance probability of a predetermined quantization value of a signal to 0; and an encoding step in which the encoder performs encoding with respect to the quantization value of the signal constrained by a process of the constraining step, on the basis of a constraint code book which is a code book having a variable length code which is longer in code length as the appearance probability decreases allocated with respect to each of a plurality of quantization values other than the predetermined quantization value of a signal for learning corresponding to the signal, the appearance probability of the predetermined quantization value of the signal for learning being constrained to 0.

(9)

A program for causing a computer to function as:

a constraint unit which constrains an appearance probability of a predetermined quantization value of a signal to 0; and an encoding unit which performs encoding with respect to the quantization value of the signal constrained by the constraint unit, on the basis of a constraint code book which is a code book having a variable length code which is longer in code length as the appearance probability decreases allocated with respect to each of a plurality of quantization values other than the predetermined quantization value of a signal for learning, corresponding to the signal, the appearance probability of the predetermined quantization value of the signal for learning being constrained to 0.

(10)

A decoder including:

a reception unit which receives a quantization value of a signal, as an encoding target in which an appearance probability of a predetermined quantization value is constrained to 0 and the quantization value is encoded on the basis of a constraint code book which is a code book having a variable length code which is longer in code length as the appearance probability decreases allocated with respect to each of a plurality of quantization values other than the predetermined quantization value of a signal for learning corresponding to the signal, the appearance probability of the predetermined quantization value of the signal for learning being constrained to 0; and a decoding unit which performs decoding with respect to the quantization value received by the reception unit, on the basis of the constraint code book.

(11)

The decoder according to (10), wherein the reception unit receives the quantization value of the signal in which the appearance probability of the predetermined quantization value is constrained to 0 and the quantization value is encoded on the basis of the constraint code book, and constraint information which shows whether or not constraint is performed, and when the constraint information shows that the constraint is performed, the decoding unit performs the decoding with respect to the quantization value received by the reception unit, on the basis of the constraint code book.

(12)

A decoding method including:

a receiving step in which a decoder receives a quantization value of a signal as an encoding target in which an appearance probability of a predetermined quantization value is constrained to 0 and the quantization value is encoded on the basis of a constraint code book which is a code book having a variable length code which is longer in code length as the appearance probability decreases allocated with respect to each of a plurality of quantization values other than the predetermined quantization value of a signal for learning corresponding to the signal, the appearance probability of the predetermined quantization value of the signal for learning being constrained to 0; and a decoding step in which the decoder performs decoding with respect to the quantization value received by a process of the receiving step, on the basis of the constraint code book.

(13)

A program for causing a computer to function as:

a reception unit which receives a quantization value of a signal as an encoding target in which an appearance probability of a predetermined quantization value is constrained to 0 and the quantization value is encoded on the basis of a constraint code book which is a code book having a variable length code which is longer in code length as the appearance probability decreases allocated with respect to each of a plurality of quantization values other than the predetermined quantization value of a signal for learning corresponding to the signal, the appearance probability of the predetermined quantization value of the signal for learning being constrained to 0; and a decoding unit which performs decoding with respect to the quantization value received by the reception unit, on the basis of the constraint code book.

REFERENCE SIGNS LIST 130 encoder, 131 constraint unit, 132 encoding unit, 133 output unit, 150 decoder, 151 reception unit, 152 decoding unit

The invention claimed is:

1. A decoder comprising:

a reception unit configured to receive a plurality of codes including a plurality of variable length codes and constraint information, wherein the constraint information identifies whether an appearance probability of a predetermined quantization value is constrained or not; and a decoding unit configured to decode the plurality of variable length codes received from the reception unit by extracting a quantization value for each of the plurality of variable length codes from a constraint code book when the appearance probability of the predetermined quantization value is constrained and from an unconstraint code book when the appearance probability of the predetermined quantization value is not constrained, wherein the appearance probability of the predetermined quantization value is constrained to 0 when a combination of Huffman decoding and multidimensional decoding is performed, and wherein the reception unit and the decoding unit are each implemented via at least one processor.

2. The decoder according to claim 1, wherein the reception unit is further configured to receive the quantization value of a signal in which the appearance probability of the predetermined quantization value is constrained to 0 and the quantization value is decoded on the basis of the constraint code book.

3. The decoder according to claim 1, wherein the plurality of quantization values comprises three values.

4. A decoder comprising:

a reception unit configured to receive a plurality of codes including a plurality of variable length codes and constraint information, wherein the constraint information identifies whether an appearance probability of a predetermined quantization value is constrained or not; and a decoding unit configured to decode the received plurality of variable length codes by extracting a quantization value for each of the plurality of variable length codes from a constraint code book when the appearance probability of the predetermined quantization value is constrained and from an unconstraint code book when the appearance probability of the predetermined quantization value is not constrained, wherein the quantization value is decoded according to a combination of Huffman decoding and multidimensional decoding on the basis of the constraint code book created according to a Huffman code allocation in which the plurality of variable length codes are longer in code length as the appearance probability decreases allocated with respect to each of the plurality of quantization values other than the predetermined quantization value of a signal for learning corresponding to the signal, and wherein the reception unit and the decoding unit are each implemented via at least one processor.

5. A decoding method, implemented via at least one processor, the method comprising:

receiving a plurality of codes including a plurality of variable length codes and constraint information, wherein the constraint information identifies whether an appearance probability of a predetermined quantization value is constrained or not; and decoding the received plurality of variable length codes by extracting a quantization value for each of the plurality of variable length codes from a constraint code book when the appearance probability of the predetermined quantization value is constrained and from an unconstraint code book when the appearance probability of the predetermined quantization value is not constrained, wherein the appearance probability of the predetermined quantization value is constrained to 0 when a combination of Huffman decoding and multidimensional decoding is performed.

6. The decoding method according to claim 5, wherein the plurality of quantization values comprises three values.

7. A non-transitory computer-readable medium having embodied thereon a program, which when executed by a computer, causes the computer to execute a method, the method comprising:

receiving a plurality of codes including a plurality of variable length codes and constraint information, wherein the constraint information identifies whether an appearance probability of a predetermined quantization value is constrained or not; and decoding the received plurality of variable length codes by extracting a quantization value for each of the plurality of variable length codes from a constraint code book when the appearance probability of the predetermined quantization value is constrained and from an unconstraint code book when the appearance probability of the predetermined quantization value is not constrained, wherein the appearance probability of the predetermined quantization value is constrained to 0 when a combination of Huffman decoding and multidimensional decoding is performed.

8. The non-transitory computer-readable medium according to claim 7, wherein the plurality of quantization values comprises three values.

* * * * *